(12) United States Patent
Sako

(10) Patent No.: US 7,847,624 B2
(45) Date of Patent: Dec. 7, 2010

(54) INTERNAL POWER SUPPLY CIRCUIT

(75) Inventor: Atsumasa Sako, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 12/186,240

(22) Filed: Aug. 5, 2008

(65) Prior Publication Data

US 2009/0039951 A1    Feb. 12, 2009

(30) Foreign Application Priority Data

Aug. 9, 2007    (JP) ............... 2007-207497

(51) Int. Cl.
  *G05F 1/10*    (2006.01)
  *G05F 3/02*    (2006.01)
(52) U.S. Cl. .............. 327/543; 327/538; 327/540; 323/313
(58) Field of Classification Search ......... 327/148, 327/157, 534–537; 363/59, 60
  See application file for complete search history.

(56) References Cited

U.S. PATENT DOCUMENTS

| | | | |
|---|---|---|---|
| 5,821,808 A | 10/1998 | Fujima | |
| 5,841,703 A * | 11/1998 | Wojciechowski | 365/189.09 |
| 6,229,385 B1 * | 5/2001 | Bell et al. | 327/565 |
| 6,483,756 B2 | 11/2002 | Takeuchi et al. | |

FOREIGN PATENT DOCUMENTS

| | | |
|---|---|---|
| JP | 9-62380 A | 3/1997 |
| JP | 2001-028188 A | 1/2001 |
| JP | 2002-152025 A | 5/2002 |

* cited by examiner

*Primary Examiner*—Lincoln Donovan
*Assistant Examiner*—Brandon S Cole
(74) *Attorney, Agent, or Firm*—Fujitsu Patent Center

(57) ABSTRACT

A disclosed invention is an internal power supply circuit, which generates an internal power supply from a first power supply. The circuit comprises a first internal step-down power supply generation unit, which generates a first internal step-down power supply from the first power supply; a normal second internal step-down power supply generation unit, which generates a second internal step-down power supply from the first internal step-down power supply in the normal operating state, and which, at the time of power supply startup, begins operation to generate the second internal step-down power supply at a first timing at which a voltage of the first internal step-down power supply reaches a prescribed reference level; and, a startup power supply load unit, which begins to consume, before the first time, current from the first internal step-down power supply.

6 Claims, 22 Drawing Sheets

FIRST EMBODIMENT

FIG.5
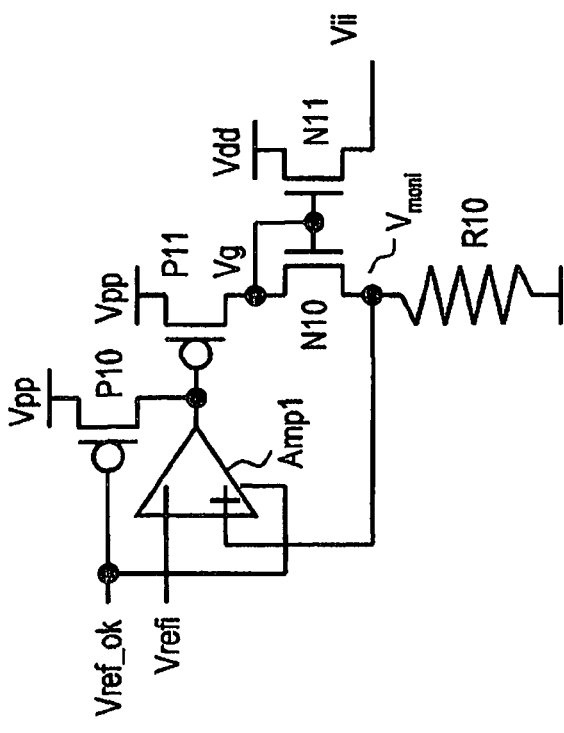
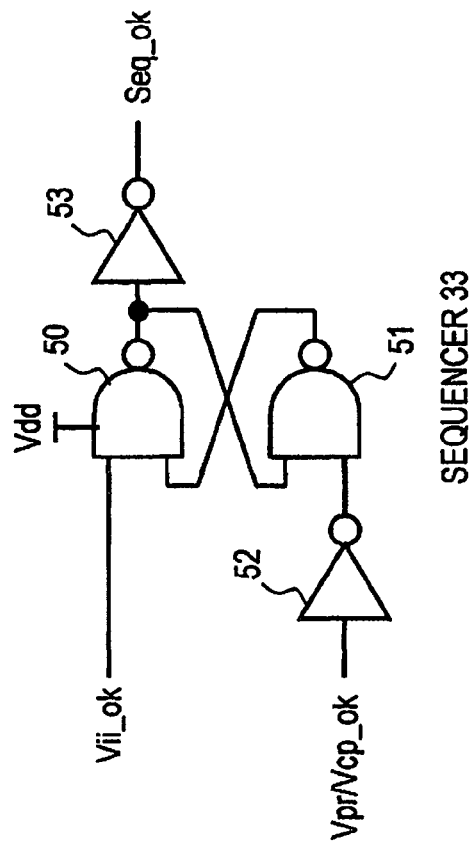

FIRST EMBODIMENT

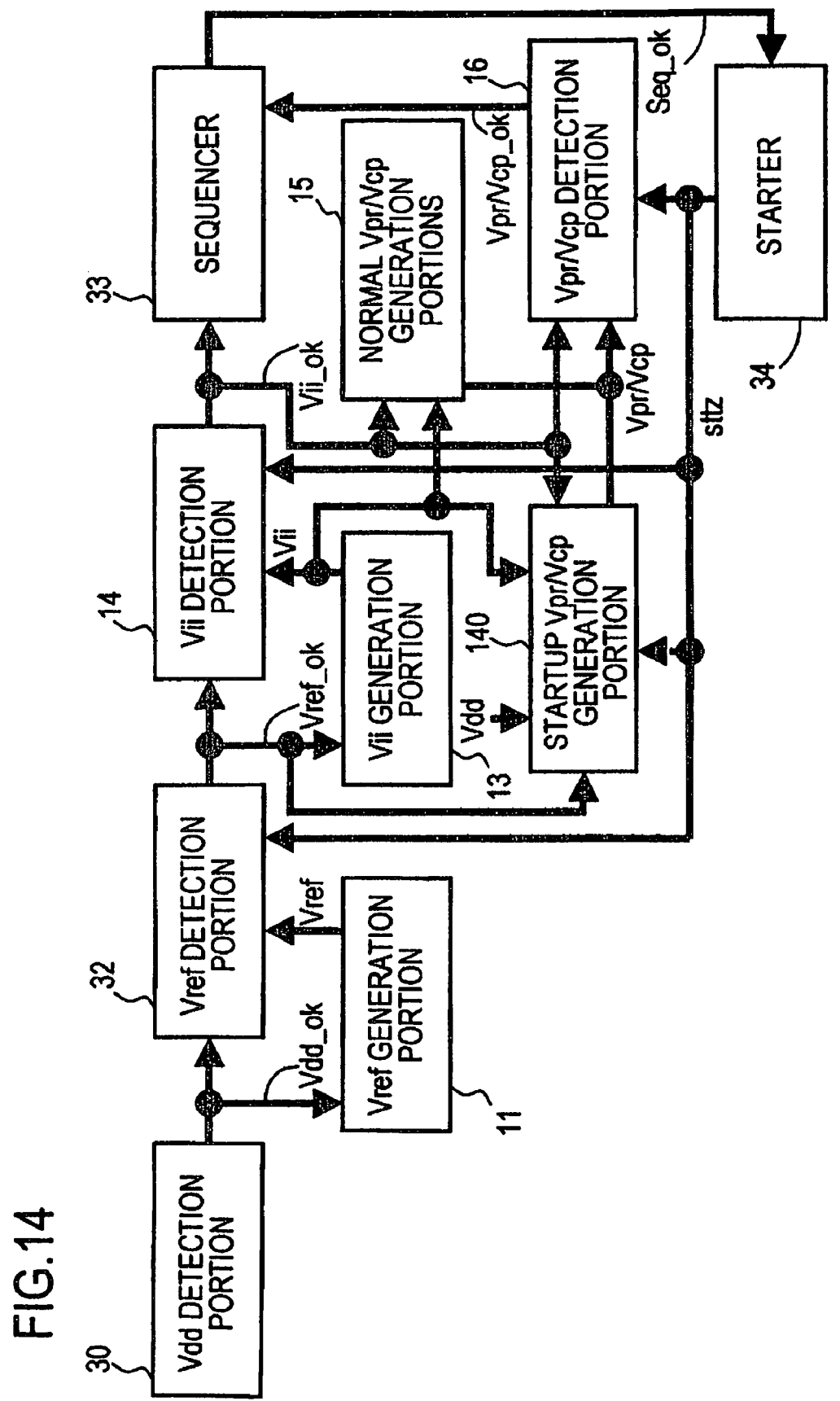
FIG.14 SECOND EMBODIMENT

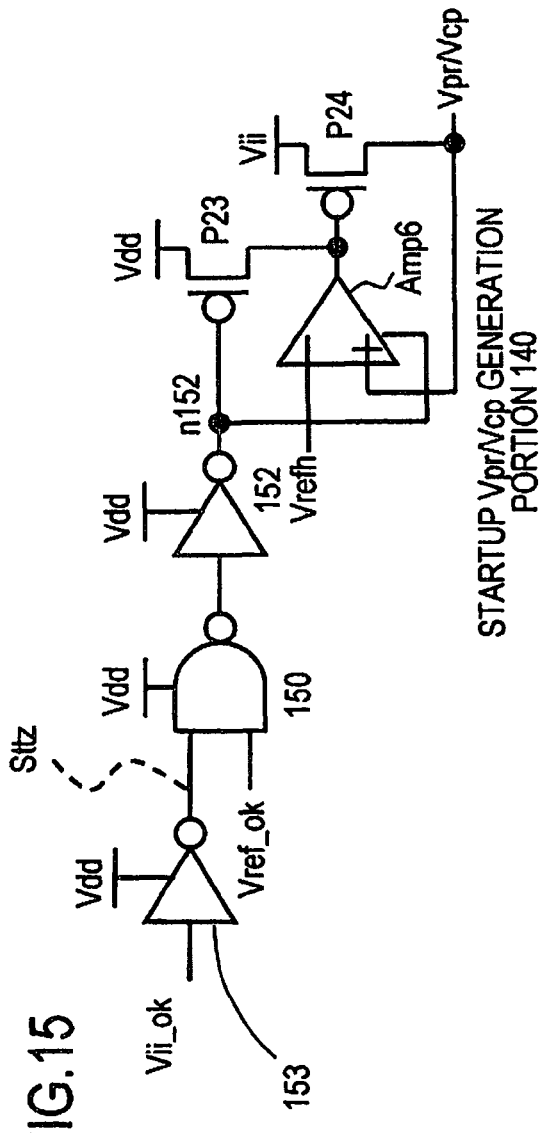
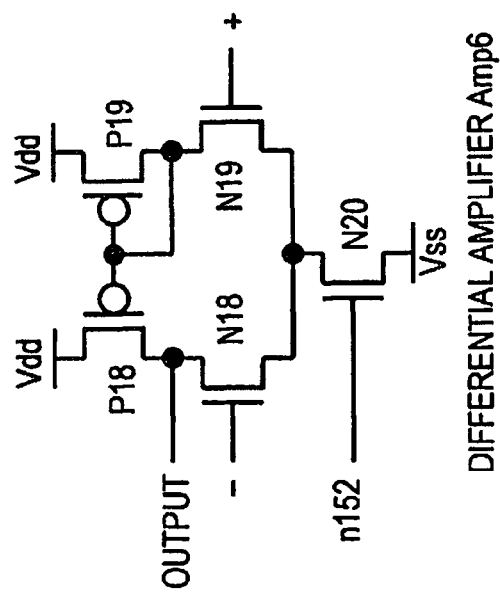
FIG.15

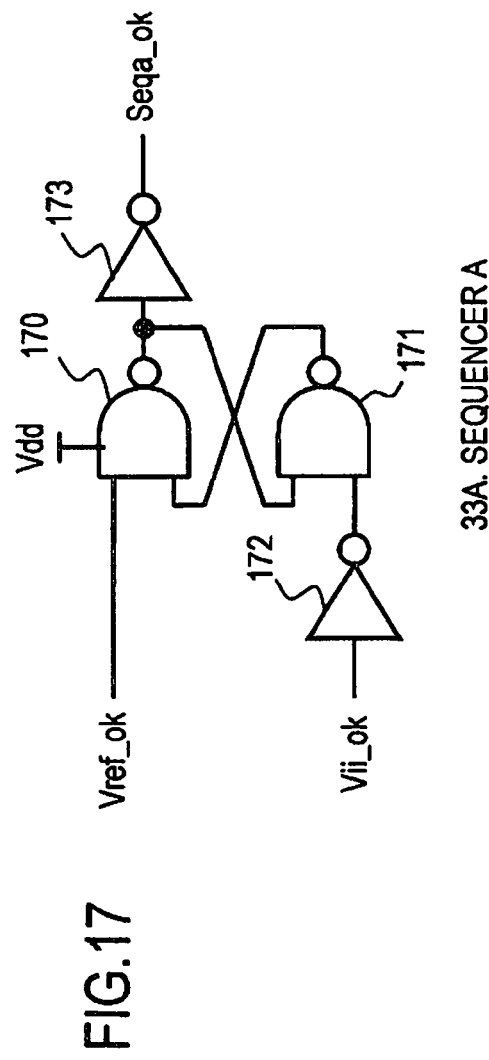
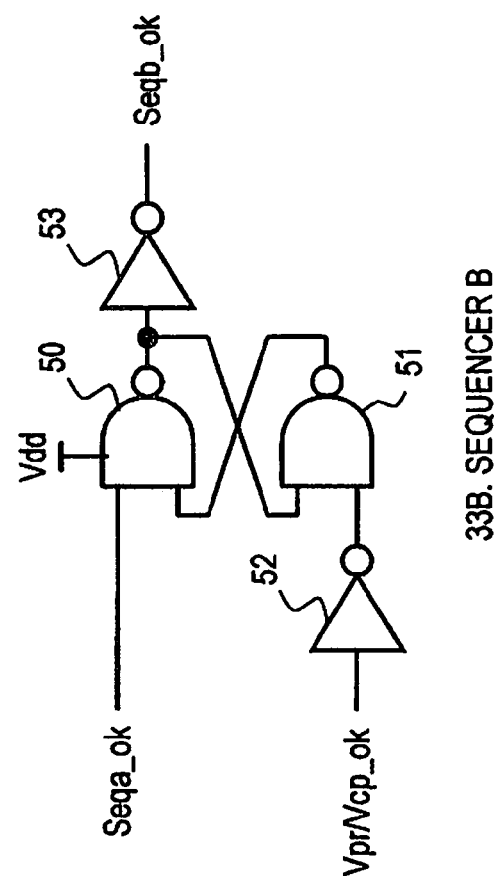
FIG.17

INTERNAL POWER SUPPLY CIRCUIT

CROSS-REFERENCE TO RELATED APPLICATIONS

This application is based upon and claims the benefit of priority from the prior Japanese Patent Application No. 2007-207497, filed on Aug. 9, 2007, the entire contents of which are incorporated herein by reference.

BACKGROUND OF THE INVENTION

1. Field

The embodiments relate to an internal power supply circuit, and in particular relates to an internal power supply circuit, the startup time of which is shortened, and which avoids wasteful power consumption.

2. Description of the Related Art

Semiconductor integrated circuits, and particularly DRAM devices, have an internal power supply circuit to generate an internal step-down power supply from an external power supply, in order to achieve both fast operation and low power consumption. The internal circuitry operates by means of the internal step-down power supply. In the case of DRAM, the internal power supply circuit generates a first internal step-down power supply voltage Vii lower than the external power supply voltage Vdd, and generates second internal step-down power supply voltages Vpr, Vcp lower than the first internal step-down power supply voltage Vii. The internal power supply circuit also generates an internal step-up power supply voltage Vpp higher than the external power supply voltage Vdd.

The first internal step-down power supply voltage Vii is supplied to the DRAM peripheral circuitry, and is also supplied to the memory core having a memory cell array. The second internal step-down power supply voltages Vpr, Vcp and the internal step-up power supply voltage Vpp are supplied to the memory core.

The first internal step-down power supply voltage Vii is generated from the external power supply voltage Vdd, while the second internal step-down power supply voltages Vpr, Vcp are generated from the first internal step-down power supply voltage Vii.

For the above reasons, at the time of power supply startup, the internal power supply circuit monitors the rise of the external power supply voltage Vdd, and after detecting the rise of this voltage starts the first internal step-down power supply generation circuit. Further, the internal power supply circuit monitors the rise of the first internal step-down power supply voltage Vii, and after detecting the rise of this voltage starts the second internal step-down power supply generation circuit. And, when the rise of the second internal step-down power supply voltages Vpr, Vcp is detected, the internal power supply circuit outputs a start signal indicating that the series of internal power supply startup operations has ended. In response to this start signal, the internal circuitry begins operation.

Internal step-down power supply generation circuits are disclosed in Japanese Patent Laid-open No. 2001-28188 and Japanese Patent Laid-open No. 09-62380. In Japanese Patent Laid-open No. 2001-28188, a circuit is disclosed which generates two internal step-down power supply voltages; in Japanese Patent Laid-open No. 09-62380, an internal step-down power supply circuit is disclosed.

SUMMARY

However, the second internal step-down power supply voltages are generated from the first internal step-down power supply voltage which is generated by the first internal step-down power supply generation circuit, so that when the second internal step-down power supply generation circuit is started after detection of the rise of the first internal step-down power supply voltage, a large load is applied to the first internal step-down power supply generation circuit. And, when the first internal step-down power supply generation circuit is not yet adequately operating, the above-described applied load is expected to cause a temporarily drop in the first internal step-down power supply voltage. A temporary drop in the first internal step-down power supply voltage induces a halt in operation of the second internal step-down power supply generation circuit, so that rising of the second internal step-down power supply voltage, which has just begun, is caused to stop. As a result, the internal power supply circuit startup sequence is lengthened, and wasteful current consumption occurs.

Hence an object of this invention is to provide an internal power supply circuit the power supply startup time of which is shortened and which avoids wasteful power consumption.

According to one of an aspect of an embodiment, an internal power supply circuit, which generates an internal power supply from a first power supply, includes a first internal step-down power supply generation unit, which generates a first internal step-down power supply from the first power supply; a normal second internal step-down power supply generation unit, which generates a second internal step-down power supply from the first internal step-down power supply in the normal operating state, and which, at the time of power supply startup, begins operation to generate the second internal step-down power supply at a first timing at which a voltage of the first internal step-down power supply reaches a prescribed reference level; and, a startup power supply load unit, which begins to consume, before the first time, current from the first internal step-down power supply.

According another aspect of the embodiment, an internal power supply circuit, which generates an internal power supply from a first power supply, includes a first internal step-down power supply generation unit, which generates a first internal step-down power supply from the first power supply; a startup second internal step-down power supply generation unit, which generates a second internal step-down power supply from the first internal step-down power supply at the time of power supply startup; and a normal second internal step-down power supply generation unit, which generates a second internal step-down power supply from the first internal step-down power supply at the time of normal operation after the power supply startup, wherein at the time of the power supply startup, the first internal step-down power supply generation unit and the startup second internal step-down power supply generation unit being made to operate in parallel; and after the power supply startup, the second internal step-down power supply generation operation is switched from the startup second internal step-down power supply generation unit to the normal second internal step-down power supply generation unit.

BRIEF DESCRIPTION OF THE DRAWINGS

FIG. 5 is a circuit diagram of a Vii generation portion and sequencer;

FIG. 14 shows the configuration of the internal power supply circuit in the second embodiment;

FIG. 15 is a circuit diagram of the startup Vpr/Vcp generation portions in the second embodiment;

FIG. 17 is a circuit diagram of two sequencers;

DESCRIPTION OF THE PREFERRED EMBODIMENTS

Figure 1:
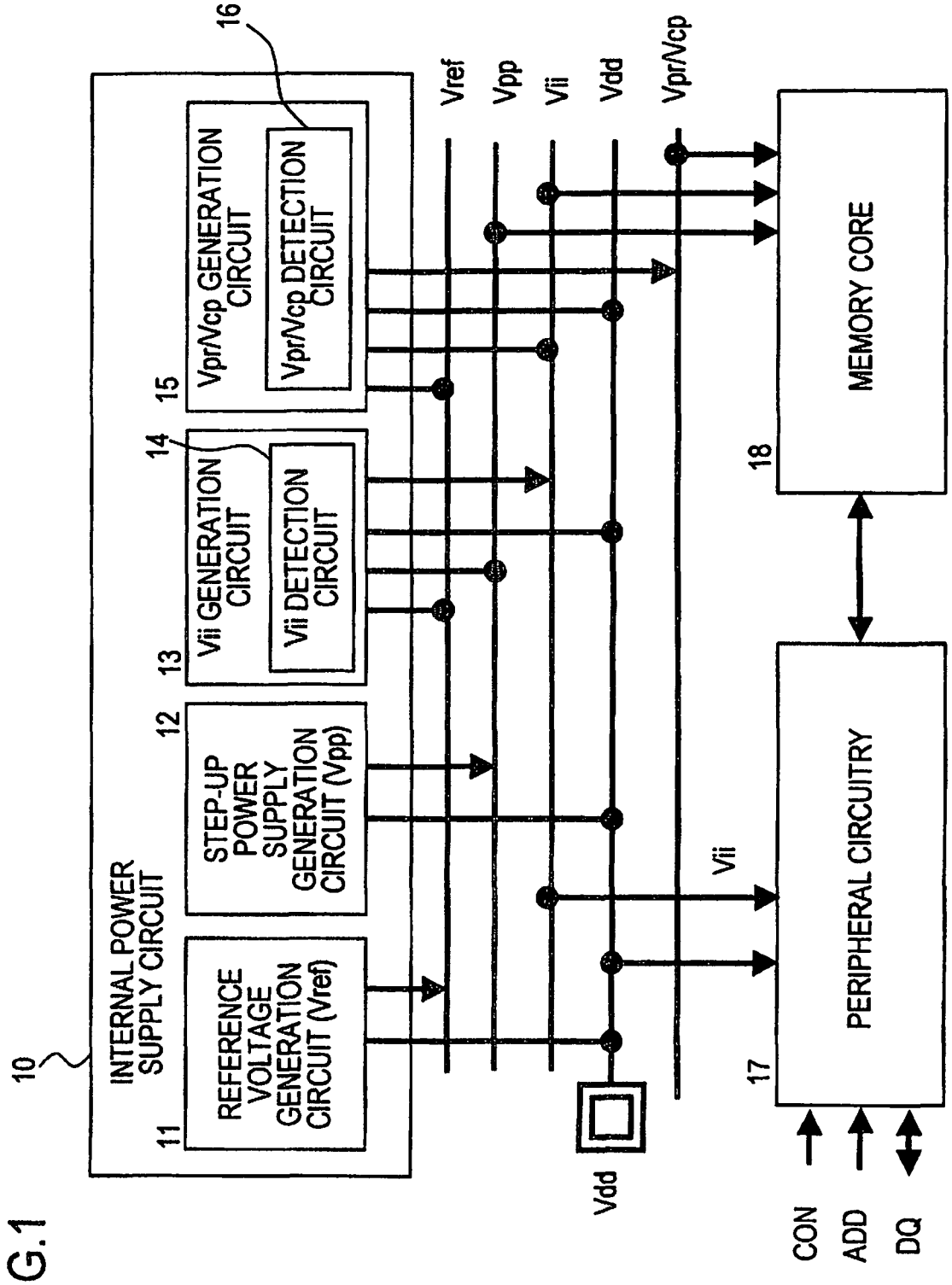
FIG. 1 shows the configuration of a DRAM device, which is one type of semiconductor integrated circuit.

Below, embodiments of the invention are explained referring to the drawings. However, the technical scope of the invention is not limited to these embodiments, but extends to the inventions described in the Scope of Claims and to inventions equivalent thereto.

FIG. 1 shows the configuration of a DRAM device, which is one type of semiconductor integrated circuit. The DRAM has a power supply unit 10, which generates internal power supply voltages from an external power supply voltage Vdd; peripheral circuitry 17, to which a first internal step-down power supply voltage Vii and the external power supply voltage Vdd are supplied; and a memory core 18, to which first and second internal step-down power supplies Vii, Vpr/Vcp, the internal step-down power supply voltage Vpp is supplied. The peripheral circuitry 17 takes as inputs a control signal CON and address ADD from a memory controller, not shown, and inputs or outputs input/output data DQ. In the memory core 18 are provided a word decoder, column decoder, memory cell array, sense amplifier, and similar.

The internal power supply circuit 10 has a reference voltage generation circuit 11, which generates a reference voltage Vref from the external power supply voltage Vdd; a step-up power supply generation circuit 12, which steps up the external power supply voltage Vdd and generates a step-up power supply voltage Vpp; a first internal step-down power supply generation circuit (Vii generation circuit) 13, which generates the first internal step-down power supply voltage Vii from the external power supply voltage Vdd; and a second internal step-down power supply generation circuit (Vpr/Vcp generation circuit) 15, which generates the second internal step-down power supply voltages Vpr/Vcp from the first internal step-down power supply voltage Vii. In addition, detection circuits 14, 16, which respectively detect the rise of the first and second internal step-down power supply voltages Vii and Vpr/Vcp, are provided.

The first internal step-down power supply voltage Vii is at a potential lower than the external power supply voltage Vdd, and the second internal step-down power supply voltages Vpr/Vcp are at potentials lower than the first internal step-down power supply voltage Vii. And, the external power supply voltage Vdd and first internal step-down power supply voltage Vii are supplied to the peripheral circuitry 17. The step-up power supply voltage Vpp, first internal step-down power supply voltage Vii, and second internal step-down power supply voltages Vpr, Vcp are supplied to the memory core 18. By causing the internal circuitry to operate using the first and second internal step-down power supplies, reduction of power consumption and high-speed operation are made possible.

Figure 2:
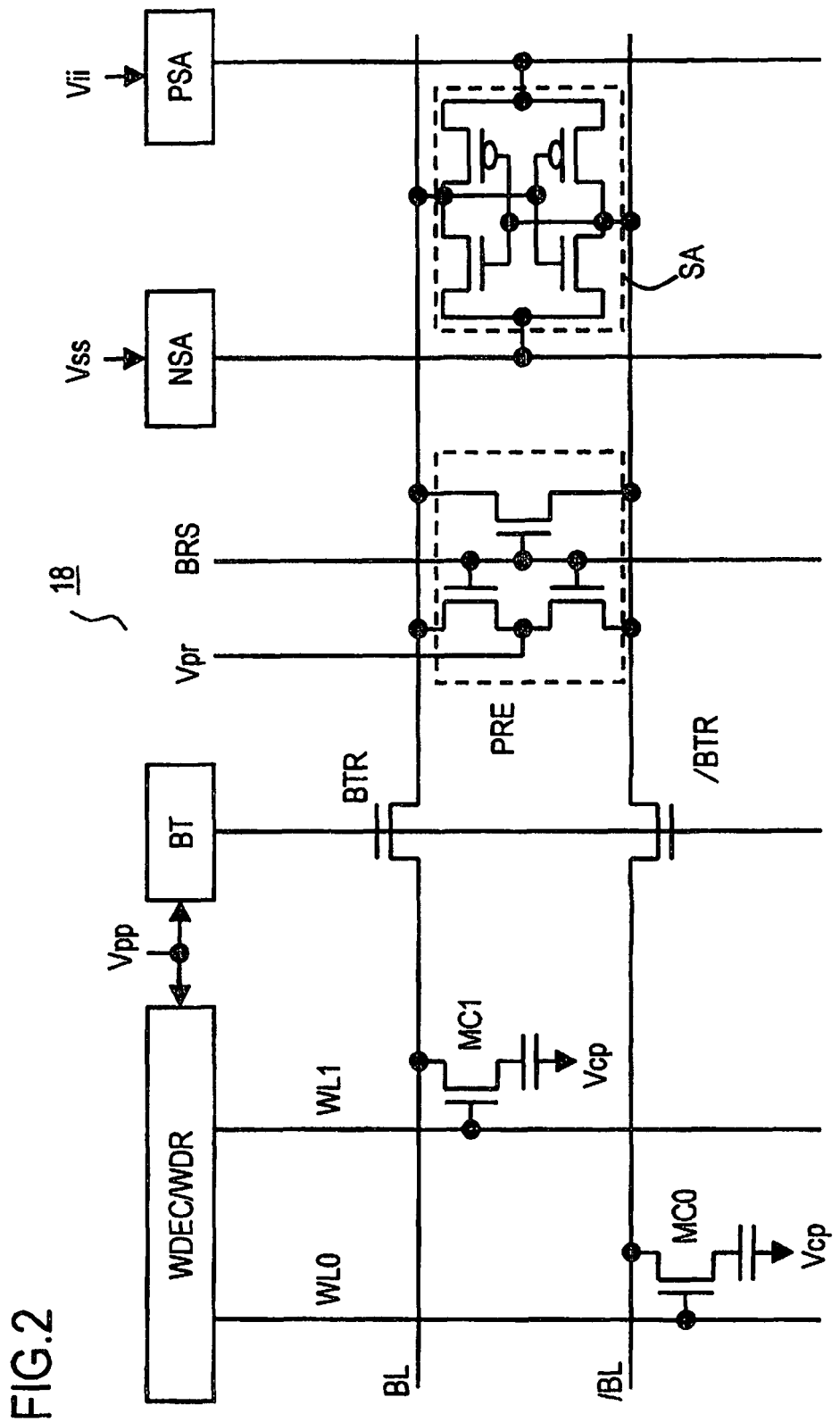
FIG. 2 shows the configuration of the memory core in DRAM.

FIG. 2 shows the configuration of the memory core 18 in DRAM. Within the memory core 18 are provided a memory cell array, having a plurality of word lines WL0, WL1, a plurality of bit line pairs BL, /BL, and a plurality of memory cells MC0, MC1 provided at the positions of intersection thereof; a word decoder/driver WDEC/WDR; a bit line precharge circuit PRE; a sense amplifier SA; and similar. The bit line pairs BL, /BL are connected via bit line transfer transistors BTR, /BTR to the bit line precharge circuit PRE and sense amplifier SA. The gates of the bit line transfer transistors BTR, /BTR are controlled by a bit line transfer driving circuit ET. The sense amplifier SA is driven by an N-channel side driving circuit NSA and a P-channel side driving circuit PSA.

The step-up power supply voltage Vpp generated by the internal power supply circuit 10 is supplied to the word decoder/word driver WDEC/WDR, and word lines WL are driven to the step-up power supply voltage level. The bit line transfer driving circuit BT is also driven by the step-up power supply voltage Vpp. The first internal step-down power supply voltage Vii is supplied to the P-channel side driving circuit PSA, and the sense amplifier SA is driven by the first internal step-down power supply voltage Vii and the ground power supply voltage Vss.

On the other hand, the second internal step-down power supply voltage Vpr is connected to the bit line precharge circuit PRE, and is used as the precharge level for the bit line pairs BL, /BL. The other second internal step-down power supply voltage Vcp is connected to the opposing electrodes of the capacitors of the memory cells MC0, MC1. That is, the internal step-down power supply voltage Vpr is the bit line precharge power supply voltage, and the internal step-down power supply voltage Vcp is the cell plate power supply voltage.

Memory operation is as follows. First, in the state in which a bit line pair BL, /BL is precharged to the level of the second internal step-down power supply voltage Vpr, one of the word lines WL0, WL1 is driven to the level of the internal step-up power supply voltage Vpp, and the information of a memory cell is read to the bit line pair. In this state, the sense amplifier SA is activated, and one line among the bit line pair is raised to the first internal step-down power supply voltage Vii, while the other line is lowered to the ground power supply voltage Vss.

Figure 3:
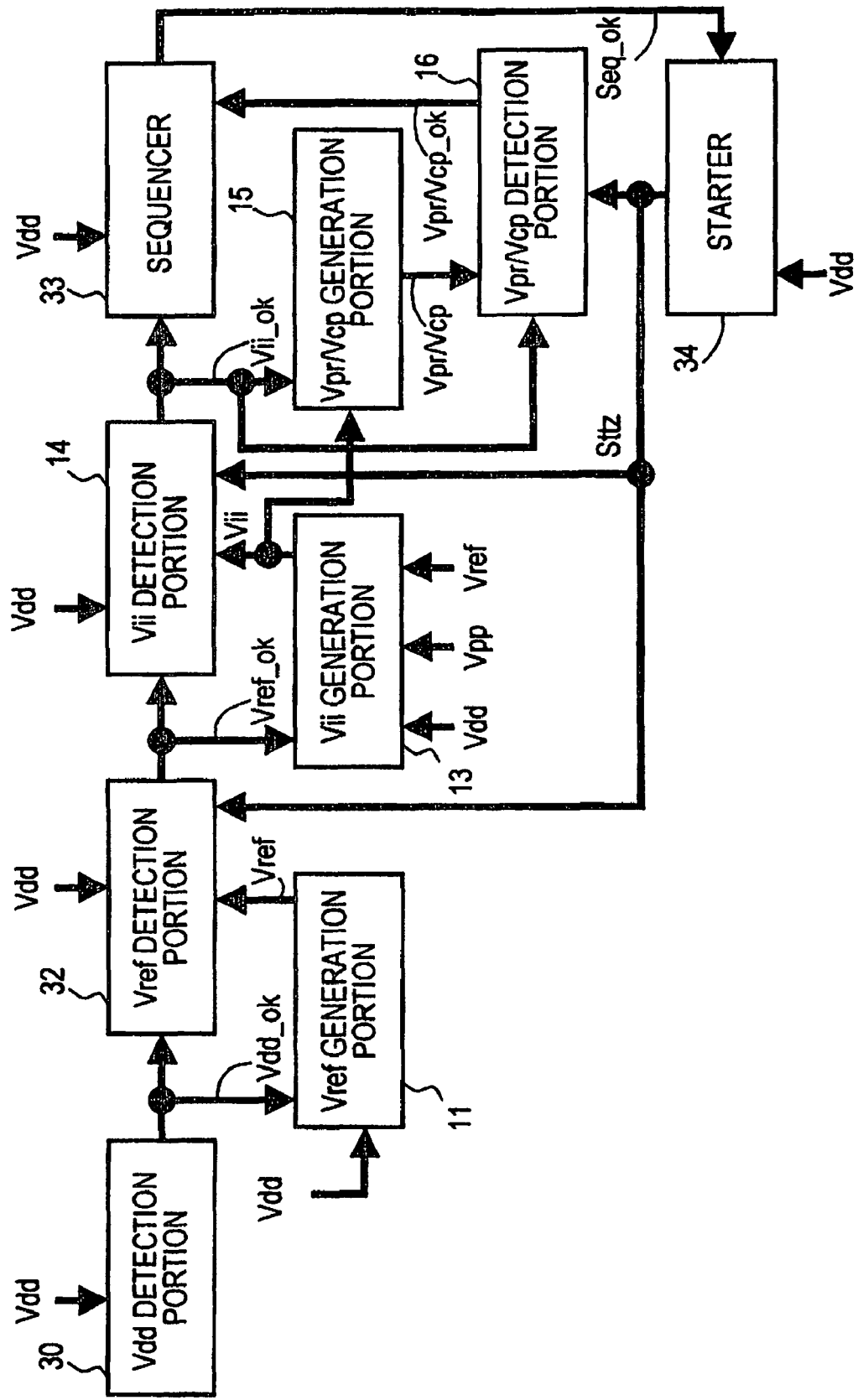
FIG. 3 shows in detail the configuration of an internal power supply circuit in a present embodiment.
Figure 4:
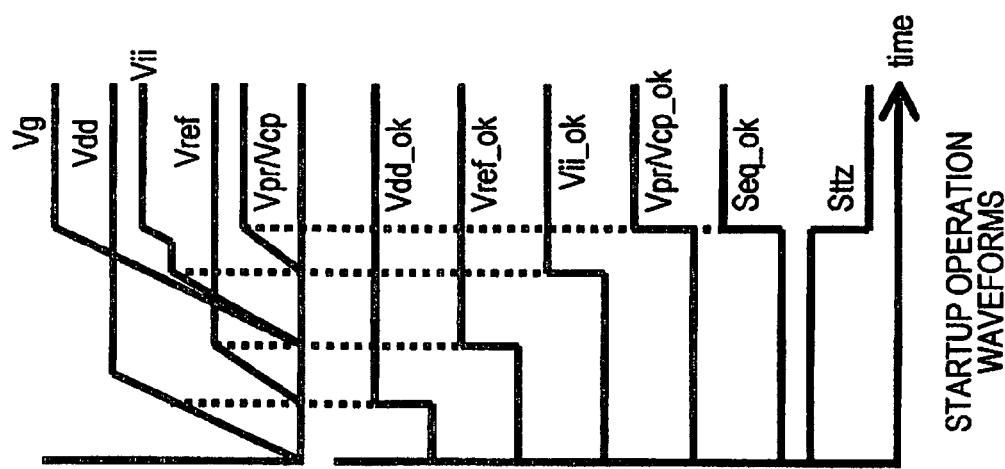
FIG. 4 shows the startup operation waveform of an internal power supply circuit.

FIG. 3 shows in detail the configuration of an internal power supply circuit in this embodiment. FIG. 4 shows the startup operation waveform of the internal power supply circuit. In FIG. 3, the step-up power supply generation circuit is omitted. The internal power supply circuit startup sequence is as follows. First, when the external power supply Vdd is input, the external power supply voltage Vdd rises. The Vdd detection portion 30 monitors the rise of the external power supply voltage Vdd, and upon detecting that the voltage has reached a prescribed criterion level, sets a Vdd detection signal Vdd_ok to H level.

In response to the H level of this Vdd detection signal Vdd_ok, the Vref generation portion 11, which is the reference voltage generation circuit, and the Vref detection portion 32 begin operation. The Vref generation portion 11 generates a reference voltage Vref from the external power supply Vdd which does not depend on the level of the external power supply voltage Vdd. Further, the Vref generation portion 11 generates a plurality of reference voltages (not shown) from the generated reference voltage Vref. These plurality of reference voltages include Vrefi for the Vii generation portion, Vrefj for Vii detection, Vrefh and Vrefl for the Vpr/Vcp generation portions, and Vrefp for the Vpr/Vcp detection portion, and are used by different internal power supply generation portions. The Vref detection portion 32 operates using the external power supply Vdd as a power supply, and upon detecting that the reference voltage Vref has reached a prescribed reference level, sets the Vref detection signal Vref_ok to H level. The reference voltage Vref is maintained at a constant potential independent of the level of the external power supply Vdd.

In response to the H level of the Vref detection signal Vref_ok, the Vii generation portion (first internal step-down power supply generation circuit) 13 and the Vii detection portion 14 thereof begin operation. The Vii generation portion 13 generates the first internal step-down power supply voltage Vii from the step-up power supply voltage Vpp, external power supply voltage Vdd, and reference voltage Vref. The Vii detection portion 14 operates with the external power supply Vdd as a power supply, and upon detecting that the first internal step-down power supply voltage Vii has reached a prescribed reference level, sets a Vii detection signal Vii_ok to H level.

In response to the H level of the Vii detection signal Vii_ok, the Vpr/Vcp generation portions (the second internal step-down power supply generation circuit) 15 and the Vpr/Vcp detection portion 16 begin operation. Upon detecting that the second internal step-down power supply voltage Vpr/Vcp has reached a prescribed reference level, the Vpr/Vcp detection portion 16 sets Vpr/Vcp detection signals Vpr/Vcp_ok to H level. The Vpr/Vcp generation portions 15 and the Vpr/Vcp detection portion 16 are provided separately for the bit line precharge power supply Vpr and for the cell plate power supply Vcp respectively. Hence as detection signals, a Vpr detection signal Vpr_ok and a Vcp detection signal Vcp_ok are generated.

When the Vii detection signal Vii_ok goes to H level and thereafter the Vpr/Vcp detection signals Vpr/Vcp_ok go to H level, the sequencer 33 latches the states thereof, and sets the sequence end signal Seq_ok to H level. In response, the starter circuit 34 sets a start signal Sttz, which had been at H level at the time of startup, to L level. In response to the L level of the start signal Sttz, the detection circuits 32, 14, 16 fix the detection state. In addition, in response to the L level of this start signal Sttz, internal circuitry, not shown, begins operation using the various internal power supplies. At this time, the internal power supply circuit 10 ends startup of all internal power supplies. Hence the internal circuitry can properly start various operations.

In the normal operating state after the start signal Sttz has gone to L level, the relative potentials of the power supplies Vdd, Vii, Vref, Vpr/Vcp are for example as shown in FIG. 4.

FIG. 5 is a circuit diagram of the Vii generation portion and sequencer. The Vii generation portion 13 has a differential amplifier Amp1, which takes as inputs to the positive and negative input terminals the monitor voltage Vmoni and reference voltage Vrefi; a P-channel transistor P1, driven by the output of the differential amplifier Amp1; an N-channel transistor N10 and resistor R10, which form a feedback loop; and a P-channel transistor P10, driven by the Vref detection signal Vref_ok. In addition, the Vii generation portion 13 has a regulator comprising an N-channel transistor N11 driven by a control voltage Vg; the drain terminal of this regulator is connected to the external power supply Vdd, and the first internal step-down power supply voltage Vii is output from the source terminal. The differential amplifier Amp1 is for example the same as the circuit shown in FIG. 7, but with Vpp as the power supply. The power supply of the regulator transistor N11 is the external power supply Vdd.

In the Vii generation portion 13, upon power supply startup the Vref detection signal Vref_ok is at L level, transistor P10 is in the on state, and transistor P11 is in the off state. Further, the differential amplifier Amp1 is in the non-operating state due to the fact that the Vref detection signal Vref_ok=L. When the Vref detection signal Vref_ok goes to H level, transistor P10 is turned off and the differential amplifier Amp1 enters the operating state. As a result, transistor P11 conducts according to the output of differential amplifier Amp1. Through feedback action of the differential amplifier Amp1, the Vii generation portion 13 controls the potential of the control voltage Vg such that the monitor voltage Vmoni and reference voltage Vrefi are at the same potential. Hence when the Vii generation portion 13 starts operation, the output of the differential amplifier Amp1 drops, causing the output transistor P11 to conduct more readily, and the control voltage Vg rises.

Then, a minute current flows through the step-up power supply Vpp, transistor P11, transistor N10, and resistor R10, and the monitor voltage Vmoni rises to a level lower than the control voltage Vg by the transistor threshold voltage. This monitor voltage Vmoni is fed back to the differential amplifier Amp1. Further, the transistor N11 also conducts more readily according to the rise in control voltage Vg, and the second internal step-down voltage Vii rises following the control voltage Vg. At this time, the load driven by the second internal step-down power supply Vii is small, being only the parasitic capacitance of the internal circuitry, and so the control voltage Vg and the second internal step-down power supply voltage Vii rise to substantially the same level.

When finally the monitor voltage Vmoni becomes equal to the reference voltage Vrefi, the output of the differential amplifier Amp1 rises, the output transistor P11 conducts less readily, and the control voltage Vg is maintained at a constant level. In the normal state after power supply startup, the N-channel transistor N11 which is the regulator supplies power from the external power supply Vdd, following power consumption of the internal circuitry, and holds the internal step-down power supply voltage Vii at the desired level.

The step-up power supply voltage Vpp and external power supply voltage Vdd are applied to the Vii generation portion 13, which therefore is configured using transistors with high withstand voltages. Moreover, circuits are designed such that the current flowing in the transistor N10 and resistor R10 of the feedback loop is kept small, while the N-channel transistor N11 of the regulator is comparatively large in size, and such that the internal step-down power supply Vii has adequate power supply capacity.

In the sequencer 33, the output of the NAND gate 51 is latched at L level and the output of the NAND gate 50 is latched at H level when Vii_ok=L and Vpr/Vcp_ok=L at power supply startup. As a result, the sequence end signal Seq_ok, which is the output of the inverter 53, is at L level. When at first the Vii detection signal Vii_ok goes to H level, the sequencer 33 maintains the latch state at the time of power supply startup. Thereafter, when the Vpr/Vcp detection signal Vpr/Vcp_ok goes to H level, the output of inverter 52 goes to L level, the output of NAND gate 51 goes to H level, the output of NAND gate 50 goes to L level, and the latch is inverted. In response, the sequence end signal Seq_ok goes to H level. This is the end of the power supply startup sequence.

Figure 6:
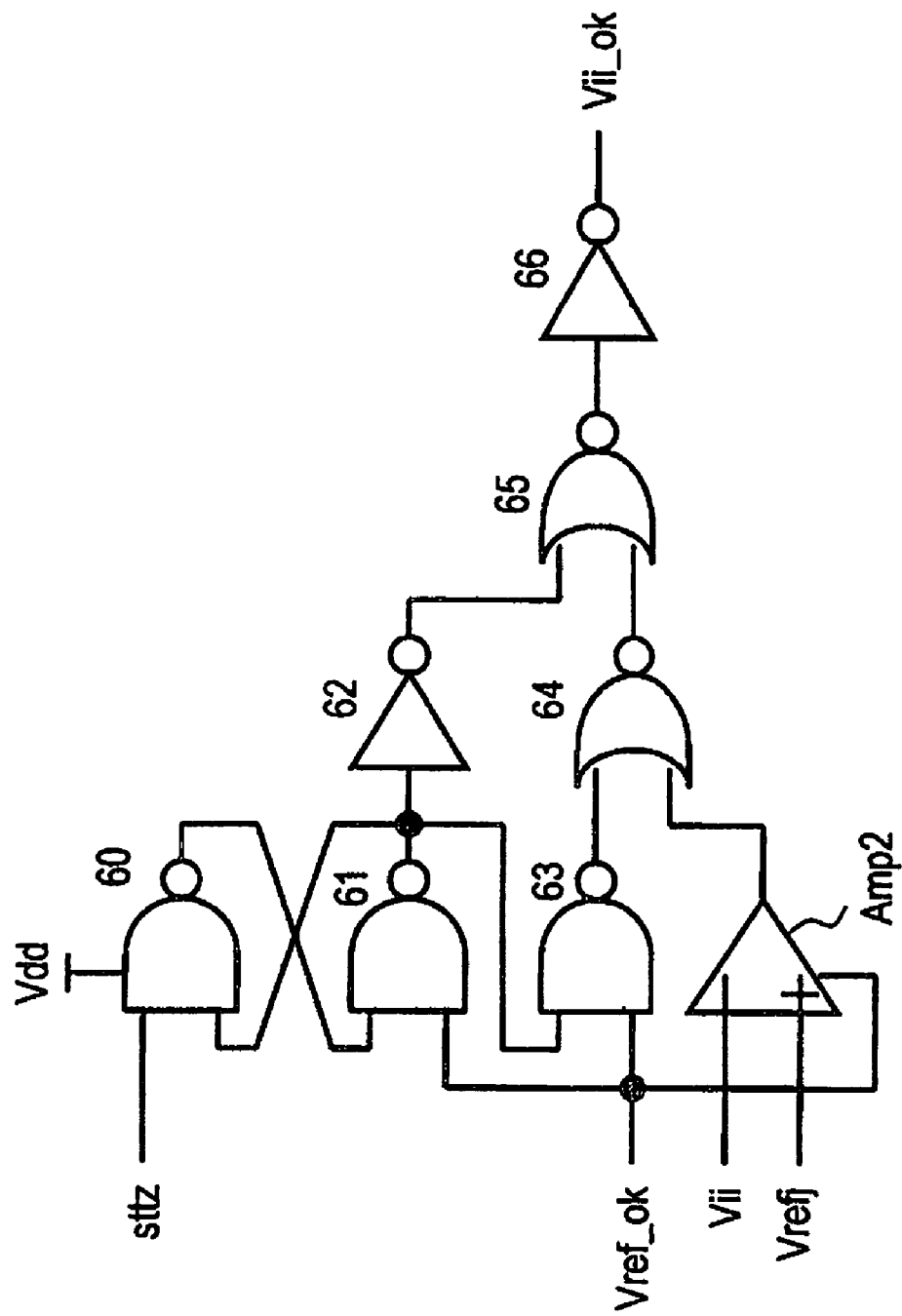
FIG. 6 is a circuit diagram of a Vii detection portion.

FIG. 6 is a circuit diagram of the Vii detection portion. The Vii detection circuit 14 has gates 60 to 66 and a differential amplifier Amp2, and operates using the external power supply Vdd. The differential amplifier Amp2 takes as inputs the first internal step-down power supply voltage Vii and reference voltage Vrefj, and detects the rising of the internal step-down power supply voltage Vii to the reference voltage Vrefj. Upon power supply startup, the start signal Sttz is at H level and the Vref detection signal Vref_ok is at L level, both inputs to the NAND gate 60 are H level, and the output is latched at L level. In this state, the Vii detection signal Vii_ok is at L level. Then, when the Vref detection signal Vref_ok goes to H level, the Vii generation portion begins operation, and the internal step-down power supply voltage Vii rises to the reference voltage Vrefj, the output of differential amplifier Amp2 changes from H level to L level, and the Vii detection signal Vii_ok goes to H level. Thereafter, when the start signal Sttz goes to L level, the two inputs to NAND gate 61 both are at H level and the output goes to L level, and this state is latched. Hence after the start signal Sttz goes to L level, the Vii detection signal Vii_ok is fixed at H level.

Figure 7:
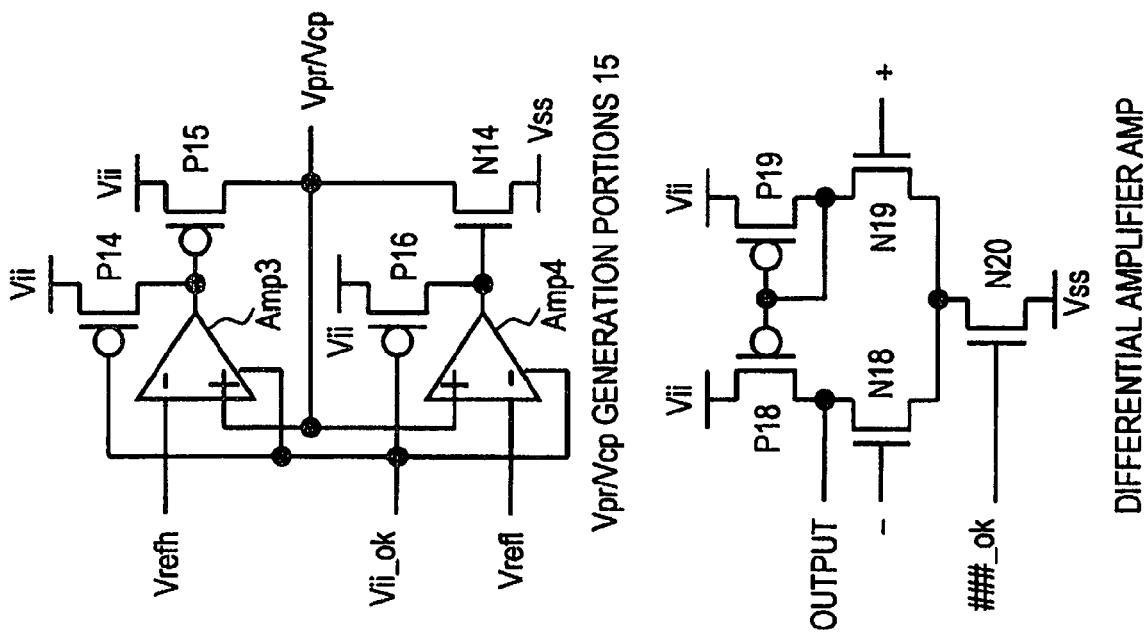
FIG. 7 is a circuit diagram of a Vpr/Vcp generation portion.

This differential amplifier Amp2 has the circuit shown in FIG. 7, but using the external power supply Vdd as the power supply, and with Vref_ok input to the gate of transistor N20.

FIG. 7 is a circuit diagram of the Vpr/Vcp generation portions. In the figure, a circuit diagram of a differential amplifier Amp is also shown. In actuality, the Vpr generation portion and Vcp generation portion are provided separately, but the two circuits are the same, and so for simplicity both circuits are shown in FIG. 7. The Vpr/Vcp generation portions 15 employ the first internal step-down power supply Vii as the operating power supply, and have transistors P15 and N14 which form a CMOS push-pull circuit; the gates of these transistors are driven by the differential amplifiers Amp3 and Amp4 respectively. The differential amplifiers Amp3 and Amp4 also use the internal step-down power supply Vii as a power supply.

The output internal step-down power supplies Vpr/Vcp and reference voltage Vrefh are input to the two input terminals of the differential amplifier Amp3, and the output internal step-down power supply Vpr/Vcp and reference voltage Vrefl are input to the two input terminals of the differential amplifier Amp4. The reference voltages Vrefh and Vrefl are such that Vrefl>Vrefh. Also, transistors P14 and P16 are controlled by the Vii detection signal Vii_ok.

Upon power supply startup, the Vii detection signal Vii_ok=L, and transistors P14 and P16 are both in the on state, the outputs of differential amplifiers Amp3 and Amp4 are clamped at H level, output transistor P15 is off, N14 is on, and the Vpr/Vcp generation portions are in the non-active state. Hence the output internal step-down power supply Vpr/Vcp is at L level. Thereafter, when the Vii detection signal Vii_ok=H, the above clamped states are released, the differential amplifiers Amp3 and Amp4 are started, and through this differential amplifier output the gates of the two transistors P15 and N14 of the push-pull circuit are controlled, and operation of the Vpr/Vcp generation portions is started.

If the output internal step-down power supply voltages Vpr/Vcp were to go to a level lower than the reference voltage Vrefh, the output of the differential amplifier Amp3 would fall to a low level, transistor P15 would conduct, and the output internal step-down power supply voltages Vpr/Vcp would rise. And, when the internal step-down power supply voltages Vpr/Vcp rise higher than the low-level side reference voltage Vrefh, the output of the differential amplifier Amp3 would go to H level, and transistor P15 would be non-conducting. As a result, rising of the output internal step-down power supply voltages Vpr/Vcp would halt. Conversely, if the output internal step-down power supply voltages Vpr/Vcp were to go to a level higher than the high-level side reference voltage Vrefl, the output of the differential amplifier Amp4 would go to a high level, and transistor N14 would be conducting, causing the level of the output internal step-down power supply voltages Vpr/Vcp to fall. Then, when the internal step-down power supply voltages Vpr/Vcp fell to a level below the high-level side reference voltage Vrefl, the output of the differential amplifier Amp4 would go to L level, and transistor N14 would become non-conducting. As a result, falling of the output internal step-down power supply voltages Vpr/Vcp would halt.

Through the above feedback control and push-pull operation, the level of the output internal step-down power supply voltages Vpr/Vcp is maintained within the level region between the reference voltages Vrefl and Vrefh. And, in response to a Vii detection signal Vii_ok=H level, operation of the Vpr/Vcp generation portions is started, and rising of the first internal step-down power supply voltage Vii due to power consumption at the start of operation is temporarily retarded.

The Vpr/Vcp generation portions operate using the internal step-down power supply Vii at low potential, and so are formed using transistors with low withstand voltages. Specifically, the transistors are small in size and using thin gate oxide films. And, if the internal step-down power supply voltage Vii has not risen to a proper level, operation of the Vpr/Vcp generation portions cannot be started.

Figure 8:
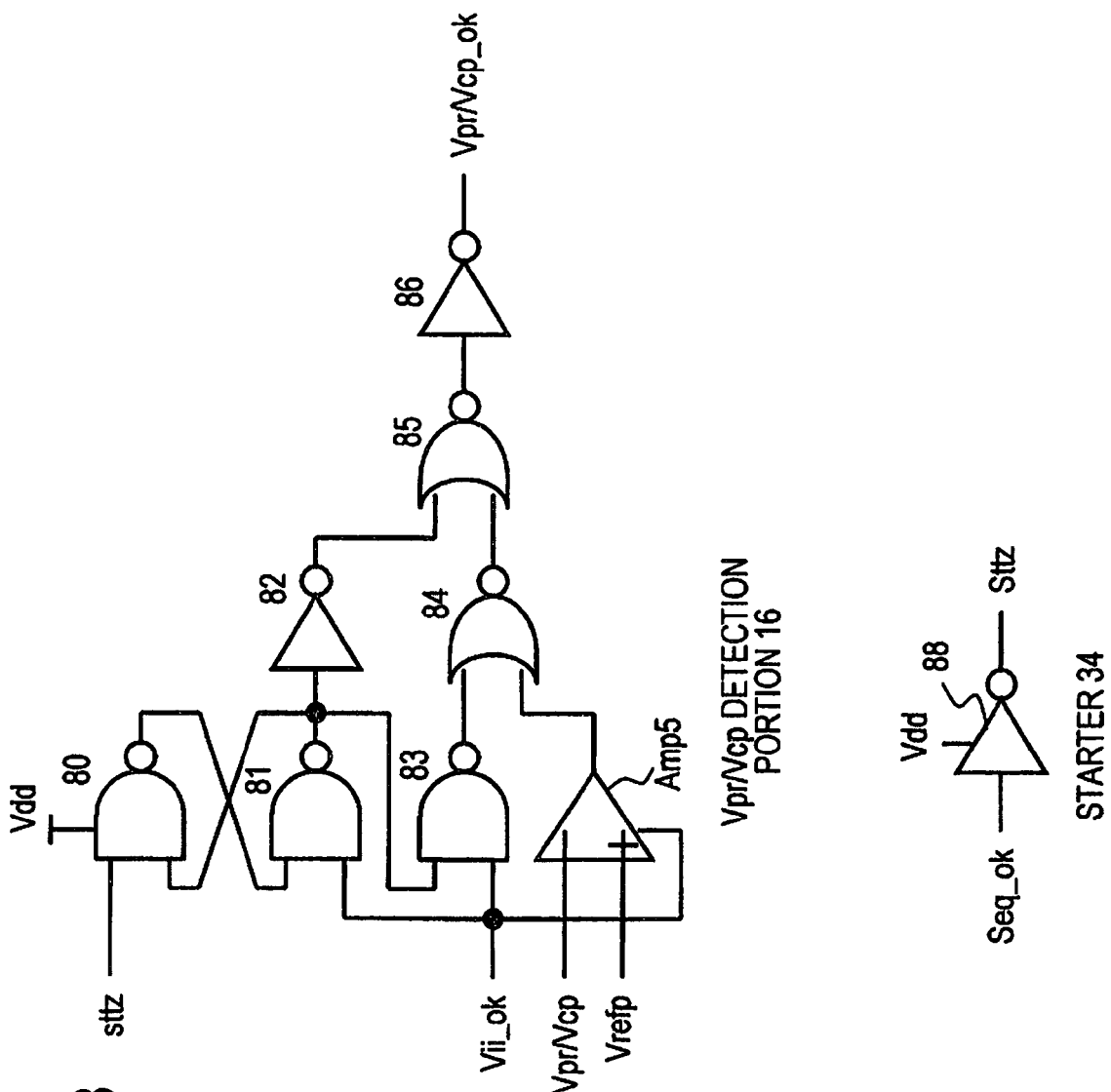
FIG. 8 is a circuit diagram of a Vpr/Vcp detection portion and starter.

FIG. 8 is a circuit diagram of the Vpr/Vcp detection portion and starter. The Vpr/Vcp detection portion 16 operates using power supply Vdd, and the circuit diagram is the same as the Vii detection portion of FIG. 6. However, the differential amplifier Amp5 takes as inputs the internal step-down power supplies Vpr/Vcp and reference voltage Vrefp, and the control signal which starts the detection portion is the Vii detection signal Vii_ok. The operation of the Vpr/Vcp detection portion 16 is similar to that of the Vii detection portion; after the Vii detection signal Vii_ok has gone to H level, when differential amplifier Amp5 detects that the internal step-down power supply voltages Vpr/Vcp have exceeded the reference voltage Vrefp, the Vpr/Vcp detection signal Vpr/Vcp_ok is set to H level. Then, with the start signal Sttz=L level, this state is fixed.

The starter 34 has an inverter 88 which operates using power supply Vdd, and in response to a sequence end signal Seq_ok=H, sets the start signal Sttz to L level.

Problem with the Vii Generation Portion 13

Figure 9A:
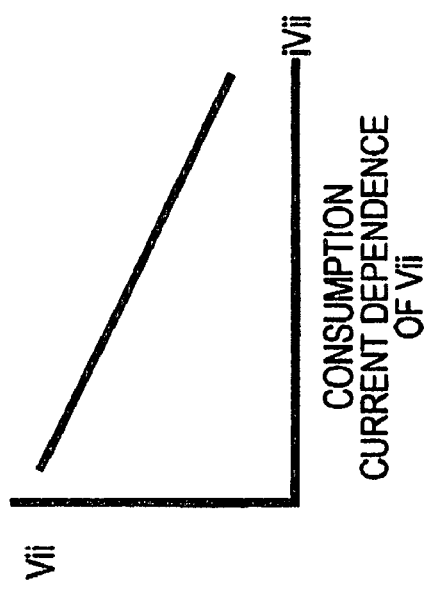
FIG. 9A and FIG. 9B show the current consumption dependence and control voltage dependence of the first internal step-down power supply voltage Vii.
Figure 9B:
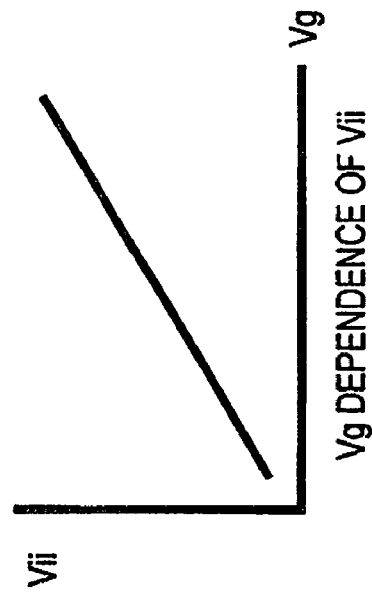

Next, a problem with the Vii generation portion 13 of FIG. 5 is explained. FIG. 9A and FIG. 9B show the current consumption dependence and control voltage dependence of the first internal step-down power supply voltage Vii. The first internal step-down power supply Vii is supplied with power from the external power supply Vdd through driving operation of the NMOS regulator N11. When power consumption by the internal circuitry increases and the power supply current iVii increases, the level of the power supply voltage Vii falls. That is, as shown in FIG. 9A, the internal step-down power supply voltage Vii has a characteristic which depends on the power supply current iVii, so that the potential falls when the power supply current iVii increases.

The potential of the first internal step-down power supply Vii is lower than the gate control voltage Vg of the NMOS regulator N11 by the transistor threshold voltage Vth. That is, as shown in FIG. 9B, the first internal step-down power supply voltage Vii has a characteristic which depends on the potential of the control voltage Vg, so that when the control voltage Vg falls the internal step-down power supply voltage Vii also falls.

Figure 10:
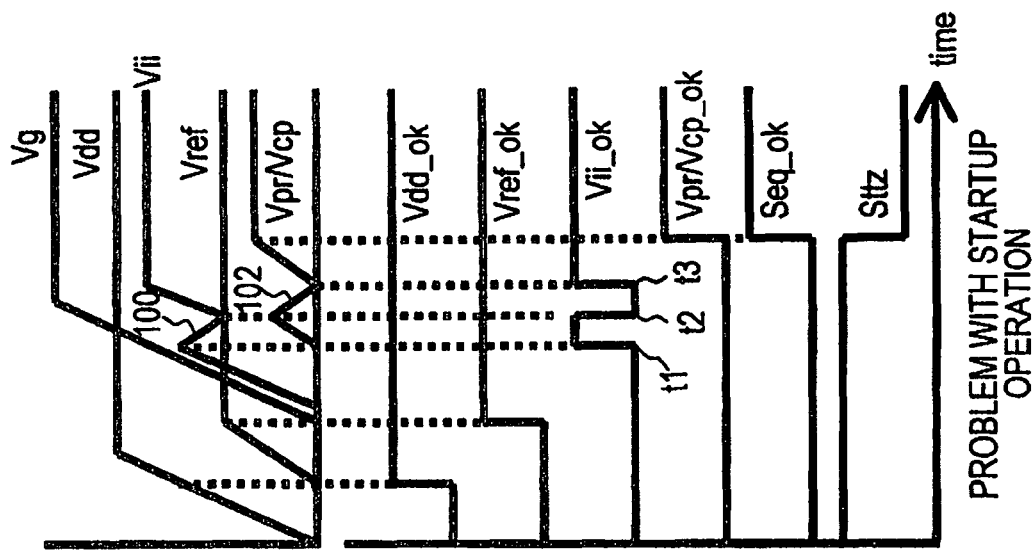
FIG. 10 illustrates a problem with the Vii generation portion.

FIG. 10 illustrates the problem with the Vii generation portion. As explained above, in response to the Vii detection signal Vii_ok=H level generated at time t1 when the first internal step-down power supply voltage Vii has risen to the prescribed reference level Vrefi, the Vpr/Vcp generation portions 15 begins generation operation of the second internal step-down power supplies Vpr/Vcp. The first internal step-down power supply Vii is not yet consumed by internal circuitry, and so a load first appears on the output terminal Vii of the Vii generation portion 13 at time t1. Hence at time t1, the power supply current iVii of the internal step-down power supply Vii increases due to conduction of transistor P15 of the push-pull circuit in the Vpr/Vcp generation portions 15. At time t1, the control voltage Vg has not yet reached saturation level, and so the potential of the first internal step-down power supply voltage Vii, which has begun to rise, temporarily declines due to the increase in the power supply current iVii (see 100 in the figure).

When, in response to this temporary decline in the internal step-down power supply voltage Vii, the Vii detection signal Vii_ok changes to L level at time t2, operation of the Vpr/Vcp generation portions 15 is halted, and the transistors P16 and N14 of the Vpr/Vcp generation portions 15 are turned on, and the second internal step-down power supply voltages Vpr/Vcp fall to ground level Vss (see 102 in the figure). That is, due to the decline of the first internal step-down power supply voltage Vii, the Vpr/Vcp generation portions 15 are halted, and the second internal step-down power supply voltages Vpr/Vcp, which had begun to rise, return to ground level.

In the Vii generation portion 13, the rise in the control voltage Vg is accompanied by a rise in the level of the first internal step-down power supply voltage Vii to the level Vg-Vth, and at time t3 the Vii detection signal Vii_ok again goes to H level, and operation of the Vpr/Vcp generation portions 15 is resumed. This time, the control voltage Vg is at an adequately high level, so that there is no decline in the level of the first internal step-down power supply voltage Vii.

As described above, due to the series of operations at times t1, t2 and t3, firstly, wasteful current consumption occurs, as indicated by 102 in the figure, and secondly, the internal power supply startup sequence is lengthened.

Embodiments

Figure 11:
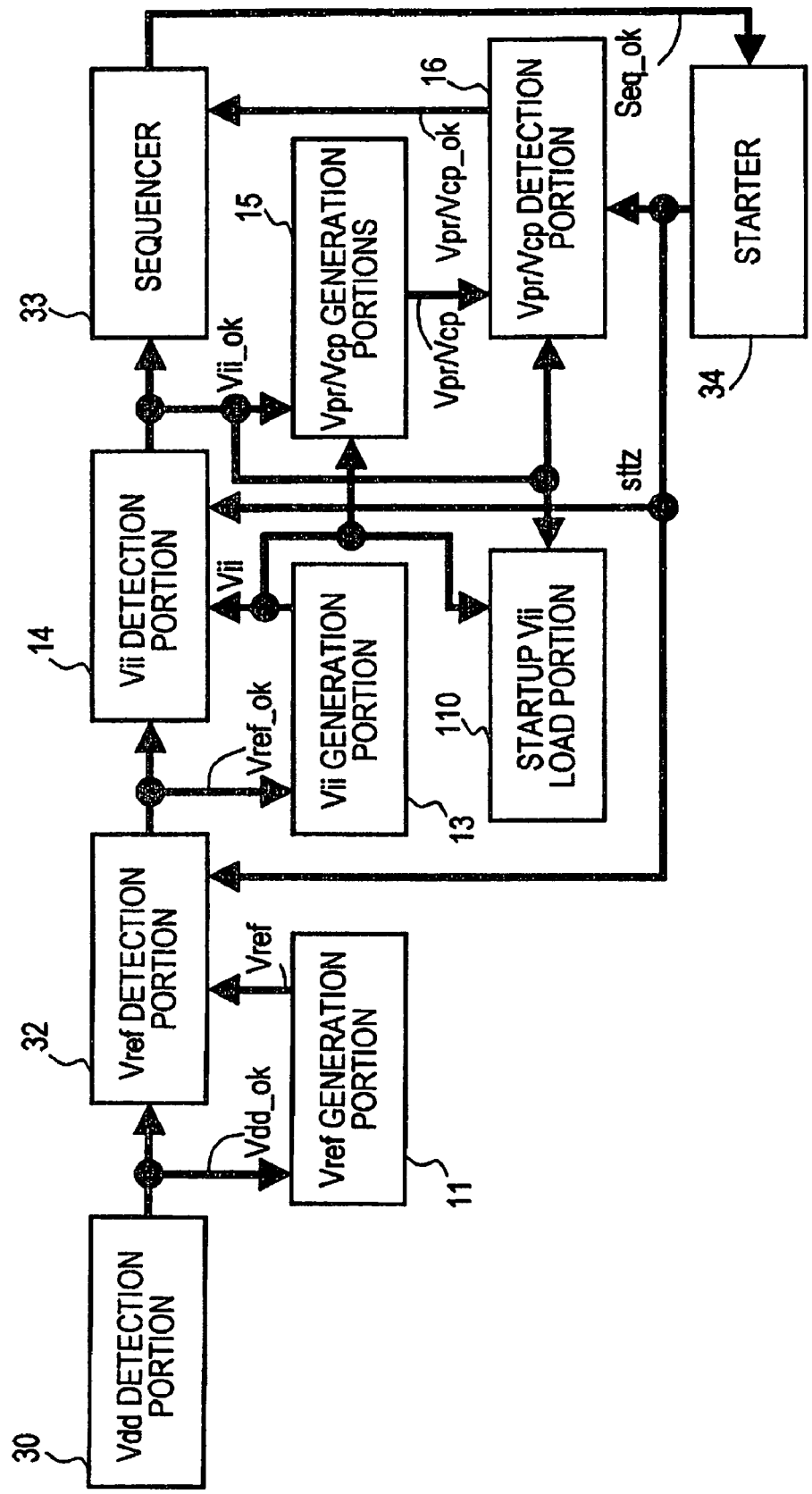
FIG. 11 shows the configuration of the internal power supply circuit in a first embodiment.

FIG. 11 shows the configuration of the internal power supply circuit in a first embodiment. The same reference numbers as in FIG. 3 are assigned. The internal power supply circuitry of FIG. 11 differs from the internal power supply circuitry of FIG. 3 in that a startup Vii load portion 110 is added; otherwise the configuration is the same. The configuration of the individual circuits is also the same as the configuration indicated in FIG. 5 through FIG. 8. The startup Vii load portion 110 operates as a load which consumes current from the first internal step-down power supply Vii, beginning with the start of power supply startup; and when the internal step-down power supply voltage Vii rises and the Vii detection signal Vii_ok=H, the current consumption thereof is halted. And, operation of the Vpr/Vcp generation portions 15 is started, and the Vpr/Vcp generation portions 15 becomes a load which consumes current from the internal step-down power supply Vii thereafter.

Figure 12A:
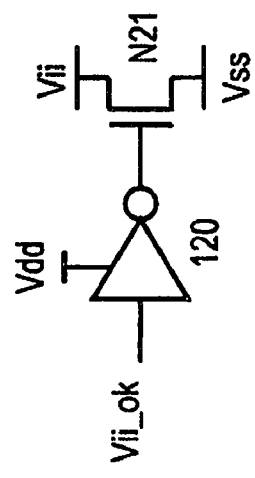
FIG. 12A and FIG. 12B are specific circuit diagrams of a startup Vii load portion.
Figure 12B:
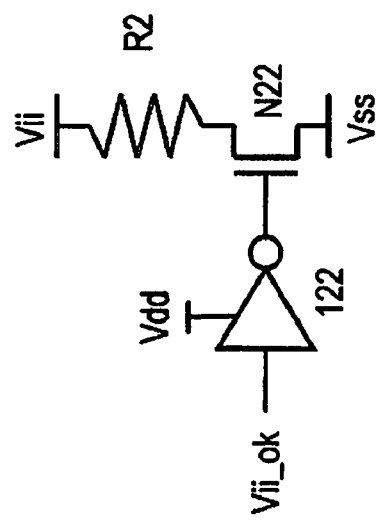

FIG. 12A and FIG. 12B are specific circuit diagrams of the startup Vii load portion 110. The Vii load portion 110 of FIG. 12A comprises an inverter 120, which operates with the external power supply Vdd, and an N-channel transistor N21, connected between the internal step-down power supply Vii and ground Vss. The Vii load portion 110 of FIG. 12B comprises an inverter 122, which operates with the external power supply Vdd, and a resistor R2 and N-channel transistor N22, connected between the internal step-down power supply Vii and ground Vss.

In both Vii load portions, the output of the inverter 120, 122 goes to H level and the transistor N21, N22 is put into the on state as a result of the Vii detection signal Vii_ok=L at the time of power supply startup. And, when the Vii generation portion 13 begins operation and the first internal step-down power supply voltage Vii begins to rise, the Vii load portion begins to consume current, and current flows in the internal step-down power supply Vii via the NMOS regulator N11 of FIG. 5. Hence even though the control voltage Vg rises due to the start of operation of the Vii generation portion 13, the internal step-down power supply voltage Vii does not follow this rise but is held at low potential, and rises at a level lower than the control voltage Vg by the threshold voltage Vth of the transistor N11.

It is desirable that current consumption by the startup Vii load portion 110 be approximately equal to or greater than current consumption by the Vpr/Vcp generation portions 15.

Figure 13A:
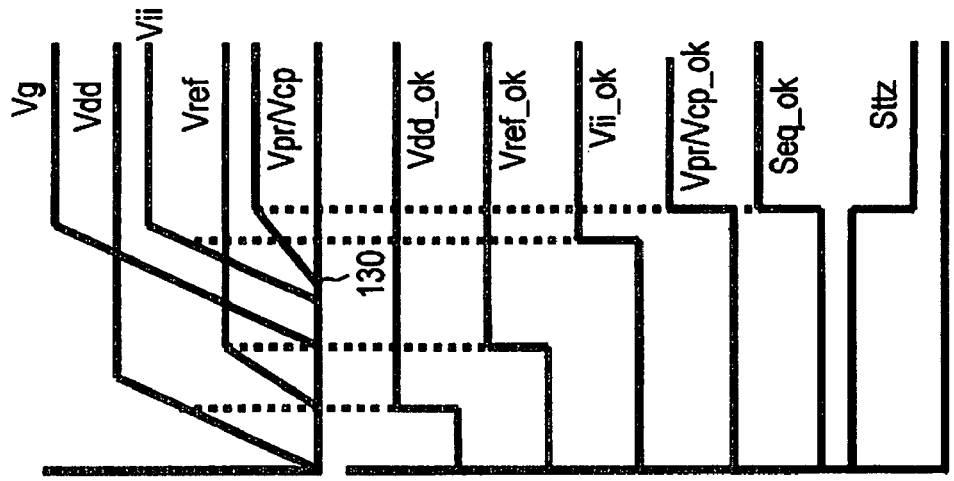
FIG. 13A and FIG. 13B are waveform diagrams at power supply startup in the first and second embodiments.
Figure 13B:
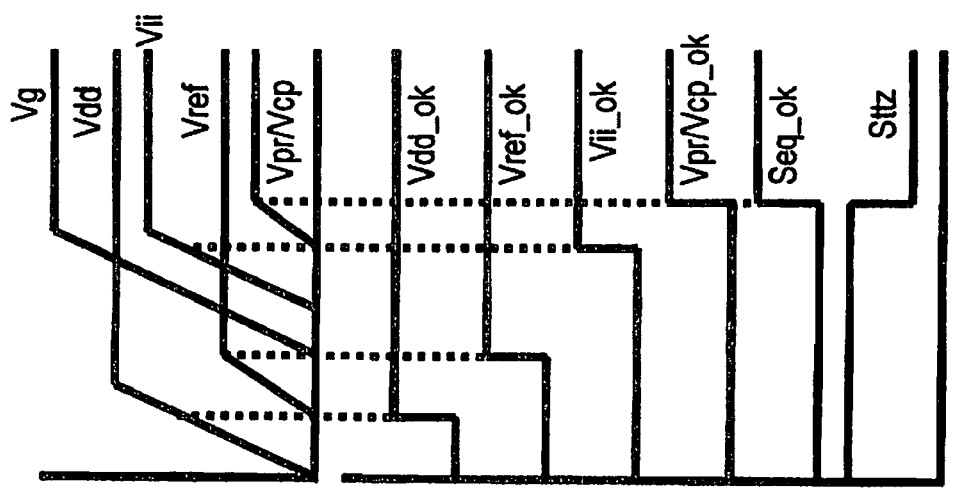

FIG. 13A and FIG. 13B are waveform diagrams at power supply startup in the first and second embodiments. As shown in FIG. 13A, in response to the Vref detection signal Vref_ok=H, operation of the Vii generation portion 13 is started, and the control voltage Vg rises. And, the first internal step-down power supply voltage Vii rises to a level lower than the control voltage Vg by the threshold voltage Vth due to current consumption by the startup Vii load portion 110. When at last, in response to the Vii detection signal Vii_ok=H, the Vpr/Vcp generation portions 15 start operation, and transistors N21 and N22 of the startup Vii load portion in FIG. 12A and FIG. 12B are turned off. At the time of this switching, the value of the power supply current iVii due to the startup Vii load portion 110 is approximately equal to or greater than the current value due to the Vpr/Vcp generation portions 15, so that there is no decline in the potential of the first internal step-down power supply voltage Vii accompanying the start of operation of the Vpr/Vcp generation portions 15.

As shown in FIG. 13A, the rise of the first internal step-down power supply voltage Vii does not follow the control voltage Vg to the same level, but the internal step-down power supply voltage Vii does not decline to cause a temporary halt in operation of the Vpr/Vcp generation portions 15 which had begun operation, so that there is no wasteful current consumption as in 102 of FIG. 10.

FIG. 14 shows the configuration of the internal power supply circuit in the second embodiment. The internal power supply circuit of the second embodiment is provided with a startup Vpr/Vcp generation portion 140 in place of the startup Vii load portion 110 of the first embodiment in FIG. 11. The startup Vpr/Vcp generation portion 140 starts operation from the time the Vii generation portion 13 begins Vii generation, and performs generation of the second internal step-down power supplies Vpr/Vcp in parallel with generation of the first internal step-down power supply Vii. When thereafter the startup Vpr/Vcp generation portion 140 halts operation, the second internal step-down power supplies Vpr/Vcp are generated only by the normal Vpr/Vcp generation portion 15. That is, at least after power supply startup, operation of the startup Vpr/Vcp generation portion 140 is halted, and the normal Vpr/Vcp generation portion 15 operates. It is preferable that the halt of operation of the startup Vpr/Vcp generation portion 140 be, for example, either when the Vii detection signal Vii_ok=H or when the start signal Sttz=L.

FIG. 15 is a circuit diagram of the startup Vpr/Vcp generation portions in the second embodiment. The startup Vpr/Vcp generation portion 140 comprises a differential amplifier Amp6, which takes as inputs the reference voltage Vrefh and the internal step-down power supplies Vpr/Vcp, and a push transistor P24 driven by the output of the differential amplifier and which outputs the internal step-down power supplies Vpr/Vcp. That is, the configuration of 140 is equivalent to the push-side circuit configuration of the Vpr/Vcp generation portion 15 shown in FIG. 7. Further, the startup Vpr/Vcp generation portion 140 has a NAND gate 150, inverters 152 and 153, and a transistor P23, and the output n152 of the inverter 152 is the activation signal of the differential amplifier Amp6. The inputs to the NAND gate 150 are either the Vii detection signal Vii_ok via the inverter 153 or the start signal Sttz, and the Vref detection signal Vref_ok.

The startup Vpr/Vcp generation portion 140 must operate before the rise of the first internal step-down power supply voltage Vii, and so the power supply used by the differential amplifier Amp6 which detects whether the internal step-down power supply voltages Vpr/Vcp exceed the reference voltage Vrefh is the external power supply Vdd, rather than the internal step-down power supply Vii. Further, the other gates 150 to 153 also use the external power supply Vdd. However, the power supply of transistor P24 is the internal step-down power supply Vii, and a power supply current iVii is consumed.

As shown by the operating waveforms in FIG. 13B, in response to the Vref detection signal Vref_ok=H, the output of NAND gate 150 goes to L level and the output n152 of inverter 152 goes to H level. As a result, the clamp transistor P23 is turned off, the differential amplifier Amp6 is activated, and the startup Vpr/Vcp generation portion 140 begins operation. Initially the output of the differential amplifier Amp6 is at L level, and the push transistor P24 is conducting and consumes current from the first internal step-down power supply Vii, and raises the second internal step-down power supply voltages Vpr/Vcp. In response to the Vref detection signal Vref_ok=H, operation of the Vii generation portion 13 is also started, and the control voltage Vg begins to rise; due to current consumption by the startup Vpr/Vcp generation portion 140, the first internal step-down power supply voltage Vii rises at a level lower than the control voltage Vg by Vth.

When finally the first internal step-down power supply voltage Vii rises to the prescribed criterion level, the Vii detection signal Vii_ok=H, and in the startup Vpr/Vcp generation portion 140, node n152=L so that the clamp transistor P23 is turned on, and generation operation of 140 halts. Simultaneously, in response to the Vii detection signal Vii_ok=H, the normal Vpr/Vcp generation portions 15 begin operation, and rising of the second internal step-down power supply voltages Vpr/Vcp is continued. If the current consumption of the startup Vpr/Vcp generation portion 140 is made comparable to or greater than the current consumption of the normal Vpr/Vcp generation portions 15, then for reasons similar to those in the first embodiment, rising operation of the first internal step-down power supply voltage Vii is not reversed to become a falling operation, the Vpr/Vcp generation portions 15 are halted, and there is no wasteful current generation. Moreover, current consumption by the startup Vpr/Vcp generation portion 140 contributes to the rise of the second internal step-down power supply voltages Vpr/Vcp, so that the efficiency of use of current can be enhanced.

As indicated by the dashed line in FIG. 15, in place of the Vii detection signal Vii_ok, the start signal Sttz may be input to the NAND gate 150. In this case, the startup Vpr/Vcp generation portion 140 operates until the start signal Sttz=L. That is, in the interval from when the Vii detection signal Vii_ok=H until the start signal Sttz=L, both the startup Vpr/Vcp generation portion 140 and the normal Vpr/Vcp generation portions 15 operate to raise the second internal step-down power supply voltages Vpr/Vcp.

In the second embodiment also, when the Vii detection signal Vii_ok=H and the normal Vpr/Vcp generation portions 15 start operation, there is no decline of the first internal step-down power supply voltage Vii, and wasteful current consumption is avoided. Further, the second internal step-down power supply voltages Vpr/Vcp rise from an earlier stage due to the startup Vpr/Vcp generation portion 140 (stage 130, earlier than Vii_ok=H in FIG. 13B), and so to this extent the rise time can be shortened.

Figure 16:
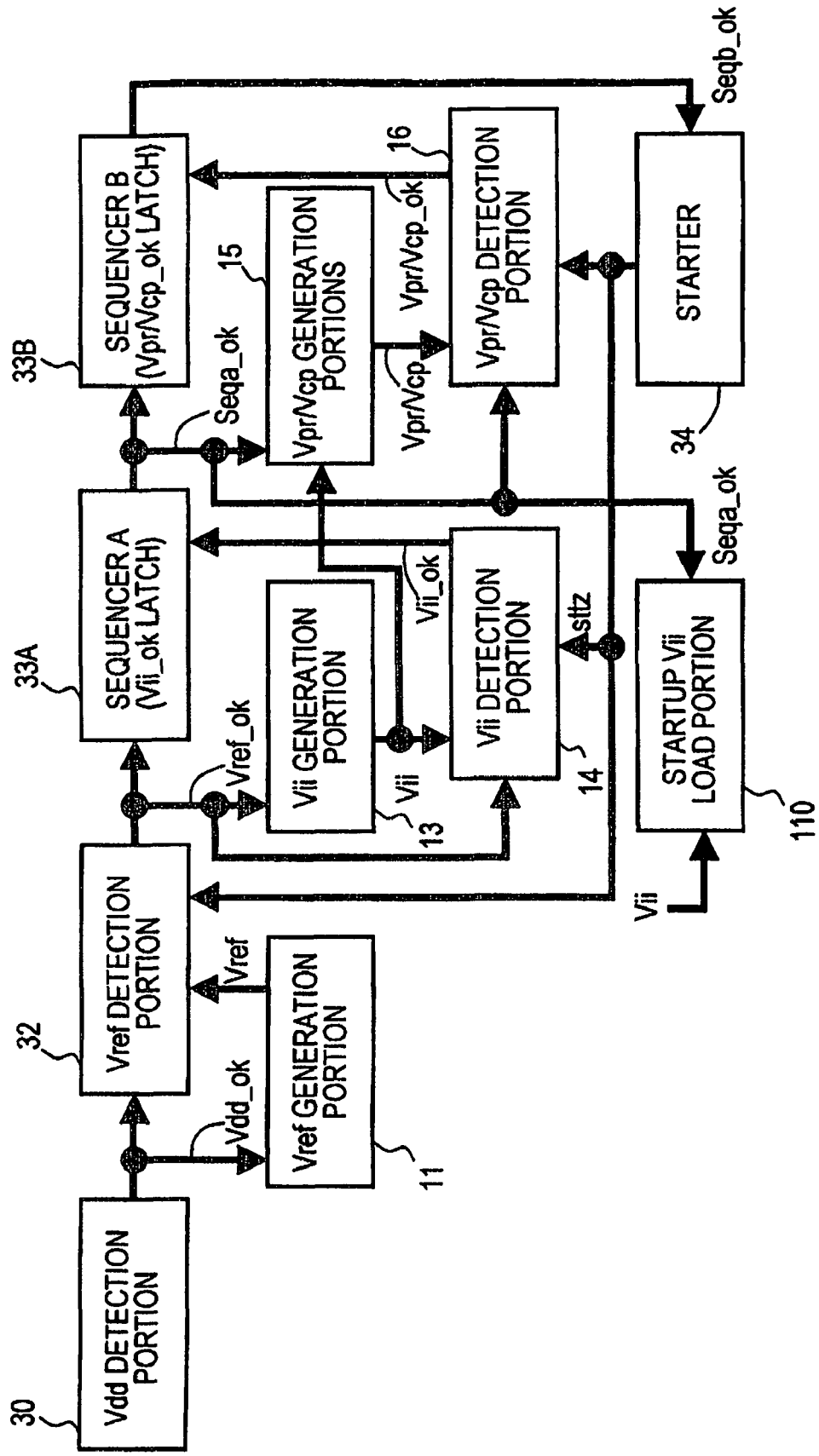
FIG. 16 shows the configuration of the internal power supply circuit in a third embodiment.

FIG. 16 shows the configuration of the internal power supply circuit in a third embodiment. This internal power supply circuit, similarly to the first embodiment shown in FIG. 11, is provided with a startup Vii load portion 110 so as to consume current from the first internal step-down power supply Vii from the time of power supply startup. However, a difference with the first embodiment is the use of a sequencer 33A and sequencer 33B instead of the sequencer 33. The sequencer 33A latches the Vii detection signal Vii_ok=H and outputs a first sequence end signal Seqa_ok=H, and the sequencer 33B latches the Vpr/Vcp detection signal Vpr/Vcp_ok=H and outputs a second sequence end signal Seq_k=H. The startup Vii load portion 110 halts operation in response to the first sequence end signal Seqa_ok=H. And, the normal operation Vpr/Vcp generation portion 15 starts operation in response to the first sequence end signal Seq_ok=H, rather than the Vii detection signal Vii_ok=H.

FIG. 17 is a circuit diagram of two sequencers. Both are latch circuits employing cross-connections of two NAND gates, configured similarly to the circuit of the sequencer shown in FIG. 5. Sequencer 33A latches the Vii detection signal Vii_ok=H and outputs a first sequence end signal Seqa_ok=H after the Vref detection signal Vref_ok has changed to H; sequencer 33B latches the Vpr/Vcp detection signal Vpr/Vcp_ok=H and outputs a second sequence end signal Seqb_ok=H after the first sequence end signal Seqa_ok has changed to H.

The startup Vii load portion 110 is the same as the circuit shown in FIG. 12A and FIG. 12B, except that instead of the Vii detection signal Vii_ok, the first sequence end signal Seqa_ok is input. Similarly, the normal Vpr/Vcp generation portion 15 is the same as the circuit shown in FIG. 7, except that instead of the Vii detection signal Vii_ok, the first sequence end signal Seqa_ok is input.

Figure 18A:
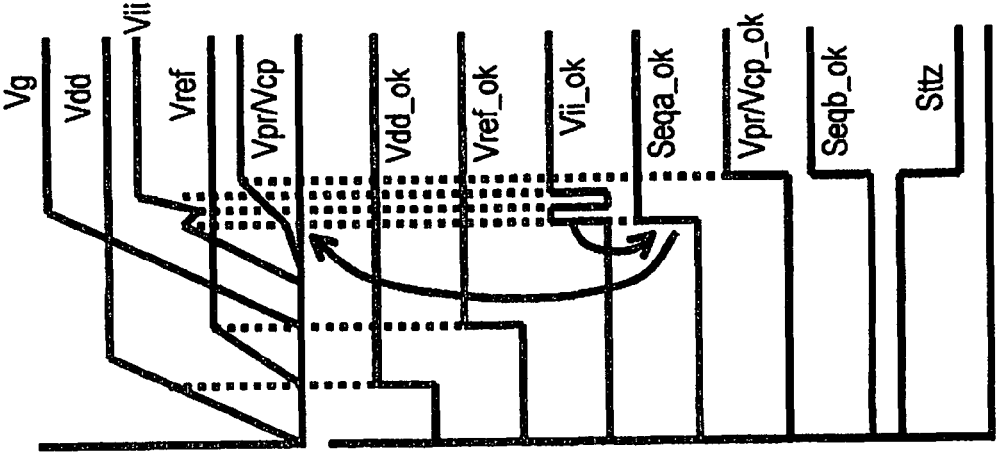
FIG. 18A and FIG. 18B are operation waveform diagrams at startup in the third and fourth embodiments.
Figure 18B:
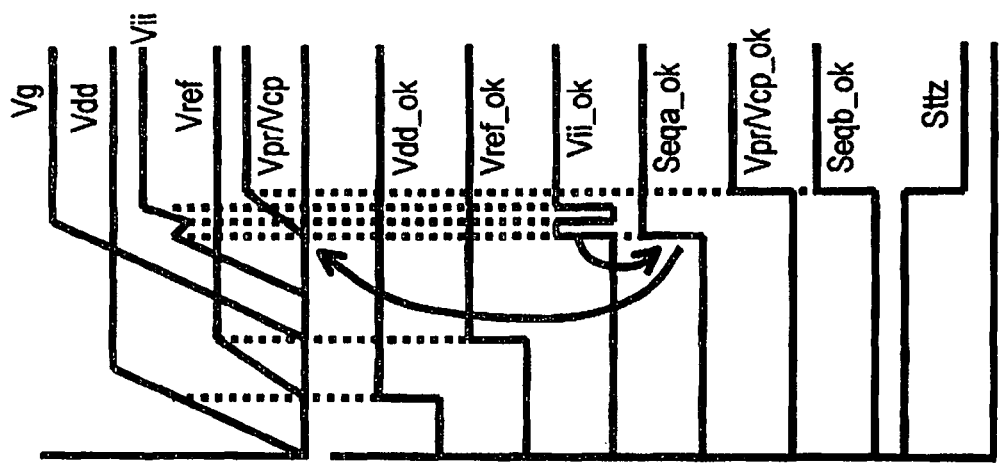

FIG. 18A and FIG. 18B are operation waveform diagrams at startup in the third and fourth embodiments. As shown in the operation waveform diagram for the third embodiment in FIG. 18A, when the Vii detection signal Vii_ok first changes to H, sequencer 33A outputs the first sequence end signal Seqa_ok=H, and the normal Vpr/Vcp generation portion 15 starts operation.

At this time, when the transistors N21 and N22 of the startup Vii load portion shown in FIG. 12A and FIG. 12B do not have adequate current consumption, due to variation in manufacturing processes, temperature conditions, and other factors, it is anticipated that the current consumption of the normal Vpr/Vcp generation portion 15 may be larger. In this case, the load of the Vii generation portion 13 increases, the first internal step-down power supply voltage Vii declines temporarily, and the Vii detection signal Vii_ok changes to L level.

However, in the third embodiment, initially the Vii detection signal Vii_ok=H is latched and the first sequence end signal Seqa_ok=H generated is used to start operation of the normal Vpr/Vcp generation portion 15, halting the startup Vii load portion 110. Hence when the normal Vpr/Vcp generation portion 15 starts operation, even if the first internal step-down power supply voltage Vii declines and the Vii detection signal Vii_ok changes to L level, the first sequence end signal Seqa_ok=H is maintained, so that there is no temporary halting of operation of the normal Vpr/Vcp generation portion 15. As a result, wasteful current consumption as in 102 in FIG. 10 is avoided.

Figure 19:
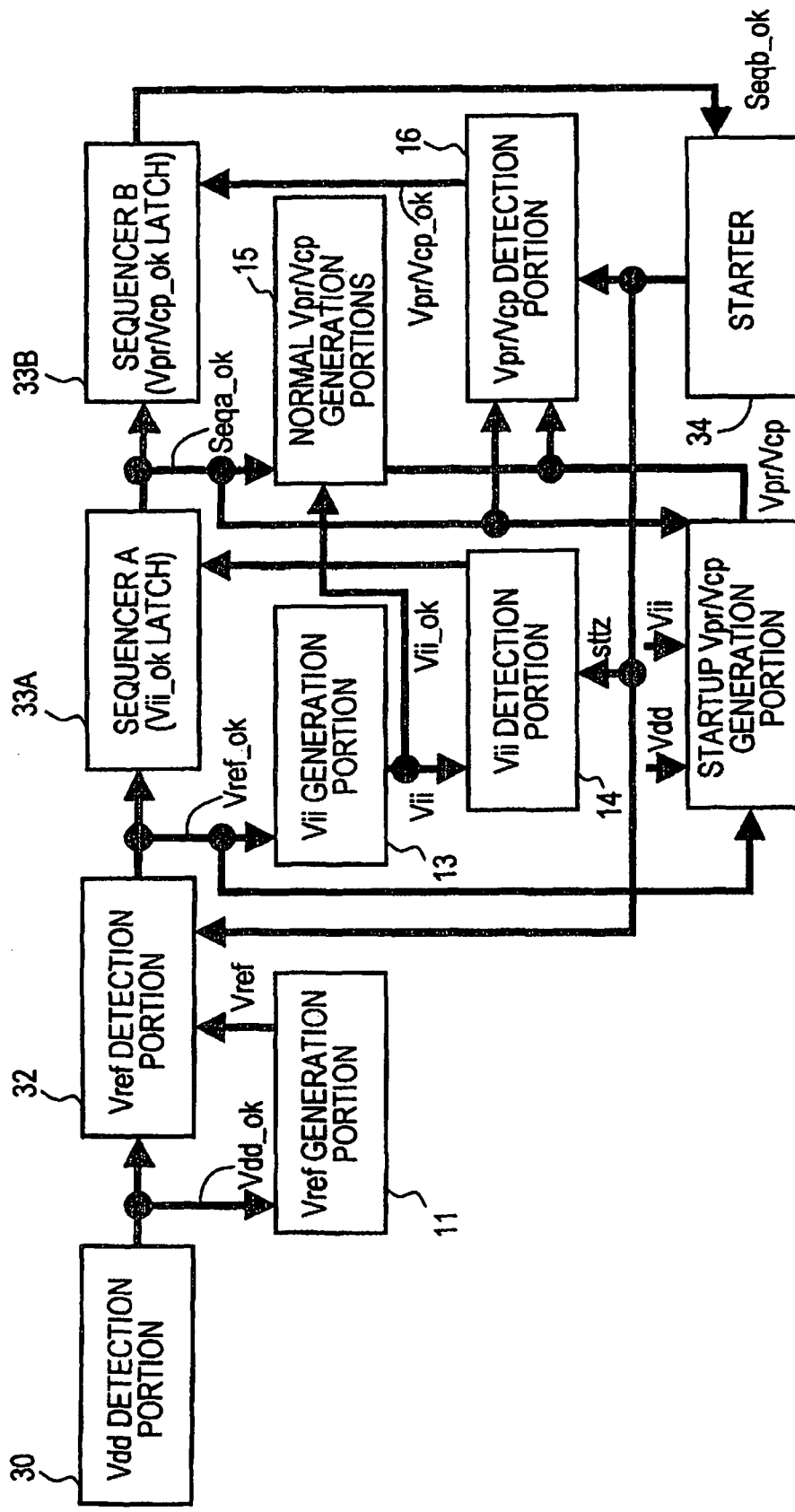
FIG. 19 shows the configuration of the internal power supply circuit in the fourth embodiment.

FIG. 19 shows the configuration of the internal power supply circuit in the fourth embodiment. This internal power supply circuit, similarly to the second embodiment shown in FIG. 14, is provided with a startup Vpr/Vcp generation portion 140, and from the time of power supply startup consumes current from the first internal step-down power supply Vii. However, similarly to the third embodiment, a sequencer 33A and sequencer 33B are provided, and the startup Vpr/Vcp generation portion 140 halts operation in response to the first sequence end signal Seqa_ok=H, while the normal Vpr/Vcp generation portion 15 starts operation in response to the first sequence end signal Seqa_ok=H.

Figure 20:
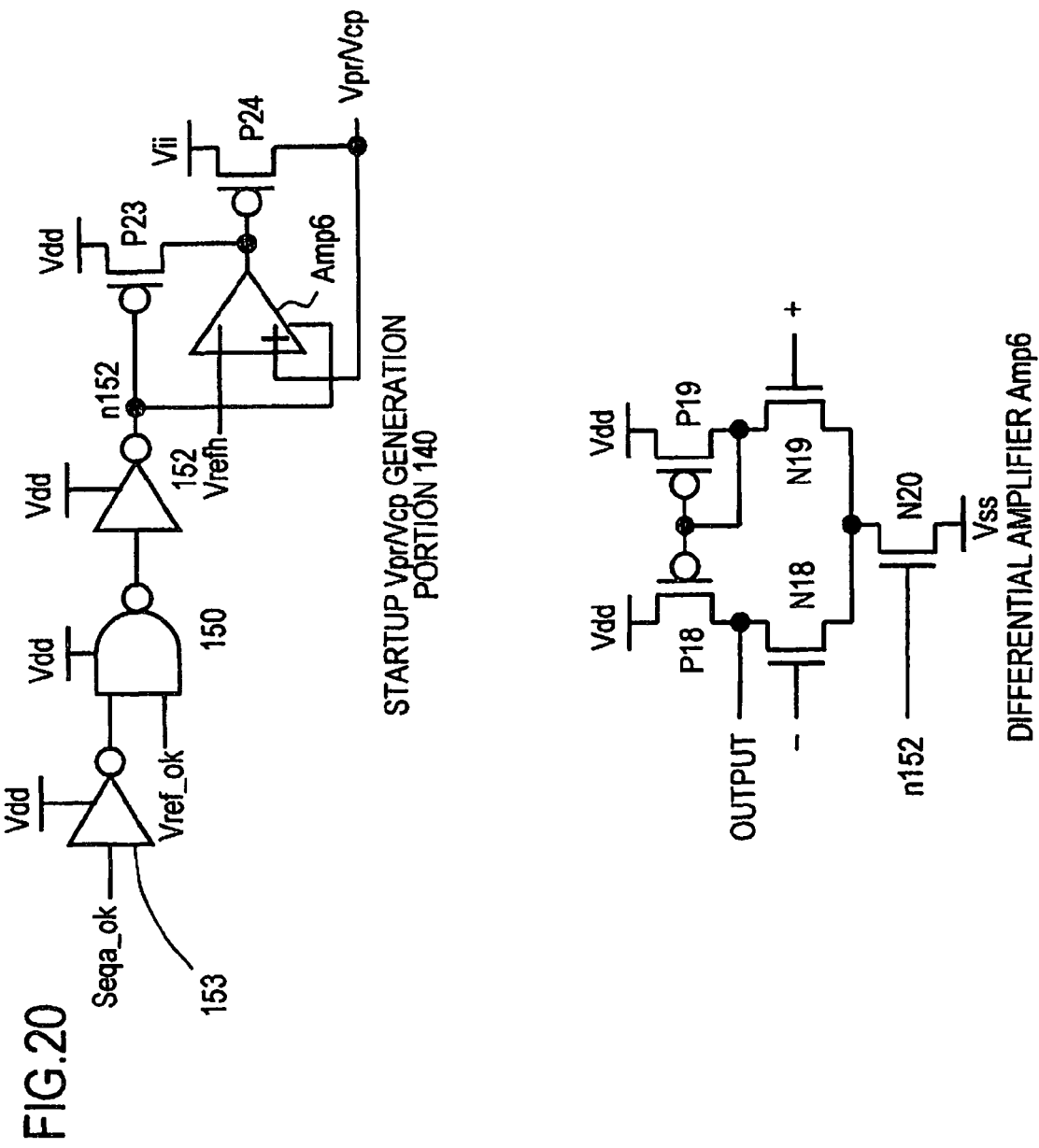
FIG. 20 is a circuit diagram of the startup Vpr/Vcp generation portion in the fourth embodiment.

FIG. 20 is a circuit diagram of the startup Vpr/Vcp generation portions in the fourth embodiment. The circuit configuration is the same as that of the startup Vpr/Vcp generation portion of the second embodiment shown in FIG. 15, except that the first sequence end signal Seqa_ok is input as a halt control signal. Hence the startup Vpr/Vcp generation portion 140 starts operation when the Vref detection signal Vref_ok=H, and halts operation when the first sequence end signal Seqa_ok=H. Further, the normal Vpr/Vcp generation portion 15 is the same as the circuit shown in FIG. 7, except that in place of the Vii detection signal Vii_ok=H, the first sequence end signal Seqa_ok=H is used as an operation start signal.

As shown in the operation waveform diagram of FIG. 18B, the normal Vpr/Vcp generation portion 15 starts operation, and the startup Vpr/Vcp generation portion 140 halts, upon the first sequence end signal Seqa_ok=H generated when the initial Vii detection signal Vii_ok=H is latched. Hence when the normal Vpr/Vcp generation portion 15 begins operation, even if the first internal step-down power supply voltage Vii declines and the Vii detection signal Vii_ok changes to L level, the first sequence end signal Seq_ok is maintained, so that there is no temporary halting of the operation of the normally operating Vpr/Vcp generation portion 15. As a result, wasteful current consumption such as in 102 in FIG. 10 is avoided.

Figure 21:
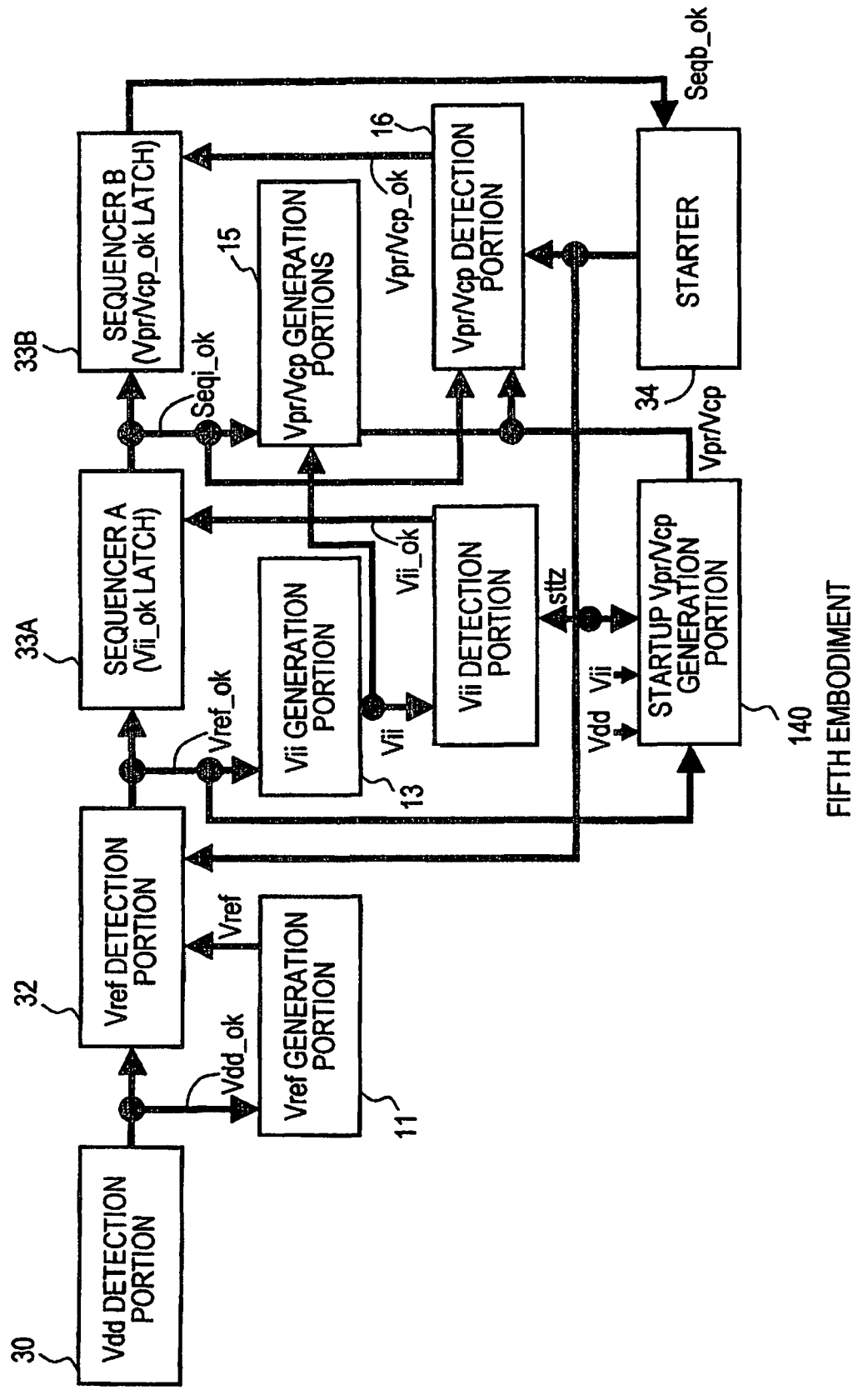
FIG. 21 shows the configuration of the internal power supply circuit in a fifth embodiment; and, FIG. 22 is a circuit diagram of the startup Vpr/Vcp generation portions in the fifth embodiment.

FIG. 21 shows the configuration of the internal power supply circuit in a fifth embodiment. In this internal power supply circuit, the halt control signal of the startup Vpr/Vcp generation portion 140 in FIG. 19 is the start signal Sttz instead of the first sequence end signal Seqa_ok. Otherwise the configuration is the same as in the fourth embodiment. Further, the operation waveforms at startup of the internal power supply circuit in the fifth embodiment is similar to those in FIG. 18B.

Figure 22:
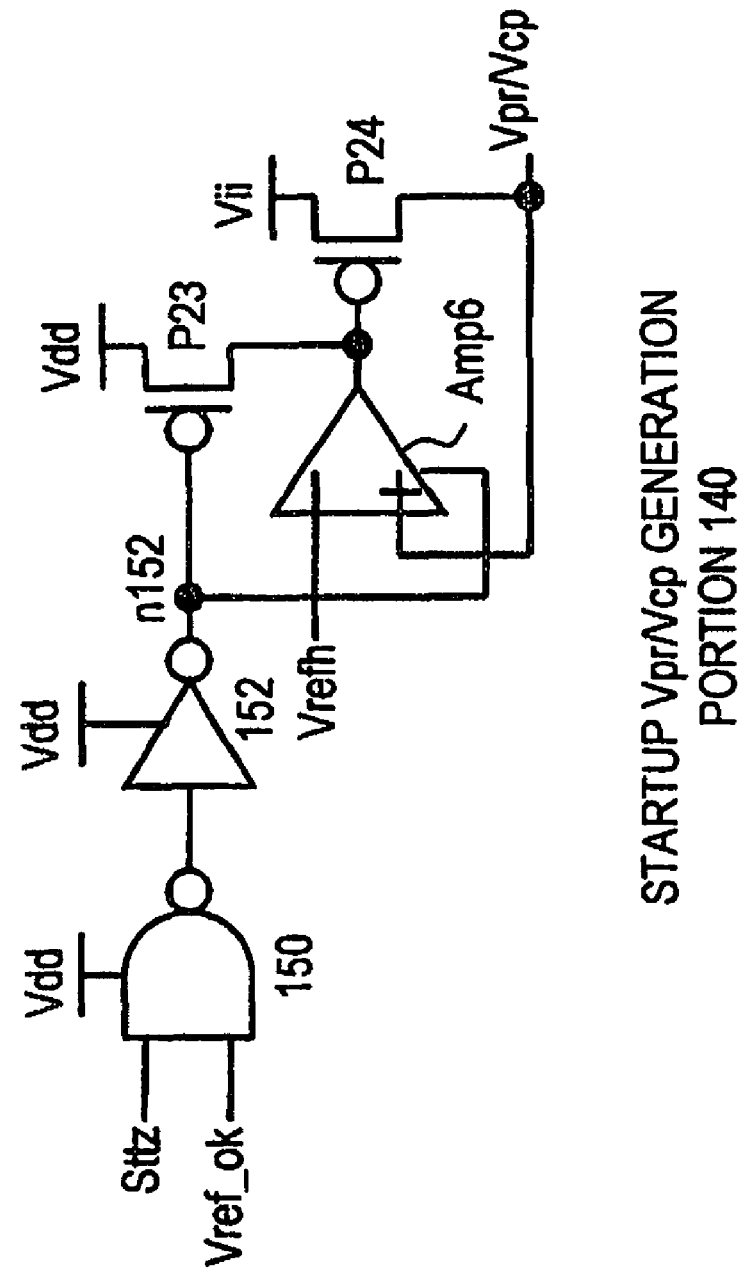

FIG. 22 is a circuit diagram of the startup Vpr/Vcp generation portions in the fifth embodiment. A difference with the startup Vpr/Vcp generation portion of FIG. 20 is that operation is halted by the start signal Sttz=H. That is, the startup Vpr/Vcp generation portion 140 starts operation in response to the Vref detection signal Vref_ok=H. By this means, load current from the output Vii of the Vii generation portion 13 is consumed, and the internal step-down power supply voltage Vii rises at the level Vth lower than the control voltage Vg.

And, when the first sequence end signal Seqa_ok=H, the normal Vpr/Vcp generation portion 15 also starts operation, and the second internal step-down power supply voltages Vpr/Vcp are made to rise by both the startup Vpr/Vcp generation portion 140 and by the normal Vpr/Vcp generation portion 15. Hence the voltage rise is rapid. Or, the sizes of transistors used in the circuit of the startup Vpr/Vcp generation portion 140 can be made smaller.

Thereafter, when the second internal step-down power supply voltages Vpr/Vcp rise to the prescribed level, and the second sequencer 33B outputs the second sequence end signal Seqb_ok=H, the start signal Sttz changes to L, and in response, operation of the startup Vpr/Vcp generation portion 140 is halted.

As explained above, in the fifth embodiment the startup Vpr/Vcp generation portion 140 starts operation when the Vref detection signal Vref_ok changes to H, and during the interval from the initial Vii detection signal Vii_ok=H until the start signal Sttz=L, both the startup Vpr/Vcp generation portion 140 and the normal Vpr/Vcp generation portion 15 operate. When the start signal Sttz changes to L, the startup Vpr/Vcp generation portion 140 halts. Hence in the case of the fifth embodiment, level fluctuations of the first internal step-down power supply voltage Vii are suppressed by the Vii load current at startup, and in addition the Vii load current at startup can be utilized without waste. Further, the circuit scale of the startup Vpr/Vcp generation portion 140 can be made small.

In the fifth embodiment, it is preferable that the current consumption of the startup Vpr/Vcp generation portion 140 be equal to or less than the current consumption of the normal Vpr/Vcp generation portion 15.

Thus by means of the above embodiments, in the internal power supply circuitry, when, after the first internal step-down power supply voltage Vii has risen the first internal step-down power supply Vii, the second internal step-down power supply Vpr/Vcp using this power supply Vii begins operation, a temporary decline in the level of the first internal step-down power supply voltage Vii is avoided. Hence wasteful current consumption on startup is suppressed, and the startup sequence is shortened.

What is claimed is:

1. An internal power supply circuit, which generates an internal power supply from a first power supply, comprising:

a first internal step-down power supply generation unit, which generates a first internal step-down power supply from said first power supply;

a normal second internal step-down power supply generation unit, which generates a second internal step-down power supply from said first internal step-down power supply in the normal operating state, and which, at the time of power supply startup, begins operation to generate said second internal step-down power supply at a first timing at which a voltage of said first internal step-down power supply reaches a prescribed reference level; and, a startup power supply load unit, which begins to consume, before said first timing, current from said first internal step-down power supply, wherein said startup power supply load unit comprises a startup second internal step-down power supply generation unit, which, through current to be consumed from said first internal step-down power supply, generates the voltage of said second internal step-down power supply.

2. The internal power supply circuit according to claim 1, wherein said startup second internal step-down power supply generation unit halts said voltage generating operation after said first timing.

3. The internal power supply circuit according to claim 2, wherein said startup second internal step-down power supply generation unit halts said voltage generating operation after a second timing, at which, after said first timing, said second internal step-down power supply voltage reaches a prescribed reference level.

4. The internal power supply circuit according to claim 1, wherein said normal second internal step-down power supply generation unit has a normal differential amplifier, which outputs a control signal according to a potential difference between the voltage of said second internal step-down power supply and a reference voltage, and a normal output transistor which raises or lowers the voltage of said second internal step-down power supply according to the control signal of said normal differential amplifier, and said normal differential amplifier and output transistor use said first internal step-down power supply as a power supply; and said startup second internal step-down power supply generation unit has a startup differential amplifier which outputs a control signal according to a potential difference between the voltage of said second internal step-down power supply and a reference voltage, and a startup output transistor which raises the voltage of said second internal step-down power supply according to the control signal of said startup differential amplifier, said startup differential amplifier uses said first power supply as a power source, and said startup output transistor uses said first internal step-down power supply as a power source.

5. The internal power supply circuit according to claim 1, wherein said startup power supply load unit halts said current consumption after said first timing.

6. The internal power supply circuit according to claim 1, wherein the voltage of said first internal step-down power supply is at potential lower than the voltage of said second internal step-down power supply, said first internal step-down power supply generation unit has a transistor having a first withstand voltage, and said normal second internal step-down power supply generation unit has a transistor having a second withstand voltage lower than said first withstand voltage.

* * * * *